US012696525B2

(12) United States Patent     (10) Patent No.:   US 12,696,525 B2
Ichikawa                             (45) Date of Patent:      Jul. 28, 2026

(54) SILICON CARBIDE SEMICONDUCTOR DEVICE

(71) Applicant: FUJI ELECTRIC CO., LTD., Kawasaki (JP)

(72) Inventor: Yoshihito Ichikawa, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 376 days.

(21) Appl. No.: 18/427,508

(22) Filed: Jan. 30, 2024

(65) Prior Publication Data

US 2024/0304716 A1     Sep. 12, 2024

(30) Foreign Application Priority Data

Mar. 6, 2023    (JP) ................................. 2023-033790

(51) Int. Cl.
     *H10D 84/00*       (2025.01)
     *H10D 30/01*       (2025.01)
               (Continued)

(52) U.S. Cl.
     CPC ....... *H10D 84/141* (2025.01); *H10D 30/0297* (2025.01); *H10D 30/665* (2025.01);
               (Continued)

(58) Field of Classification Search
     CPC .. H10D 84/141; H10D 30/668; H10D 62/111; H10D 62/8325; H10D 30/0297; H10D 30/665; H10D 62/127; H10D 62/157; H10D 62/393; H10D 64/519; H10D 62/107; H01L 29/7813; H01L 29/7811; H01L 29/7803; H01L 29/66068; H01L 29/4238; H01L 29/1095; H01L 29/1608; H01L 29/0878; H01L 29/0696; H01L 29/0623; H01L 29/0634
See application file for complete search history.

(56) References Cited

U.S. PATENT DOCUMENTS

2019/0288082 A1    9/2019   Sagawa et al.
2020/0083338 A1*   3/2020   Kinoshita ............ H10D 62/107
                 (Continued)

FOREIGN PATENT DOCUMENTS

JP      2019-161181 A    9/2019
JP      2020-136315 A    8/2020

*Primary Examiner* — Earl N Taylor
(74) *Attorney, Agent, or Firm* — Rabin & Berdo, P.C.

(57)             ABSTRACT

A semiconductor device having a first polysilicon layer of a gate runner that is electrically connected to a gate pad via a built-in gate resistor constituted by a second polysilicon layer, and has a potential lower than that of the gate pad. The first polysilicon layer is disposed apart from a third polysilicon layer. The third polysilicon layer directly beneath the gate pad and the first polysilicon layer are apart from each other and face each other across an insulation layer in a direction parallel to a front surface of a semiconductor substrate. The surface of a portion of the insulation layer between the first and third polysilicon layers that are adjacent to each other is covered by a gate metal wiring layer of the gate runner, and is fixed to the potential of the gate metal wiring layer when pn junctions directly beneath the gate pad are reverse biased.

6 Claims, 21 Drawing Sheets

(51) Int. Cl.

| | |
|---|---|
| *H10D 30/66* | (2025.01) |
| *H10D 62/10* | (2025.01) |
| *H10D 62/13* | (2025.01) |
| *H10D 62/17* | (2025.01) |
| *H10D 62/832* | (2025.01) |
| *H10D 64/27* | (2025.01) |

(52) U.S. Cl.
CPC ......... *H10D 30/668* (2025.01); *H10D 62/107* (2025.01); *H10D 62/111* (2025.01); *H10D 62/127* (2025.01); *H10D 62/157* (2025.01); *H10D 62/393* (2025.01); *H10D 62/8325* (2025.01); *H10D 64/519* (2025.01)

(56) References Cited

U.S. PATENT DOCUMENTS

| | | | |
|---|---|---|---|
| 2020/0091339 A1* | 3/2020 | Okumura | H10D 30/668 |
| 2020/0294989 A1* | 9/2020 | Okumura | H10D 89/60 |
| 2021/0013128 A1* | 1/2021 | Okumura | H10P 74/273 |
| 2021/0367048 A1 | 11/2021 | Yamada et al. | |
| 2022/0278212 A1* | 9/2022 | Ryu | H10D 30/665 |

* cited by examiner

<PATTERN 1>

SILICON CARBIDE SEMICONDUCTOR DEVICE

CROSS REFERENCE TO RELATED APPLICATIONS

This application is based upon and claims the benefit of priority of the prior Japanese Patent Application No. 2023-033790, filed on Mar. 6, 2023, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, in a semiconductor device with an insulated gate having a metal-oxide film-semiconductor (MOS) three-layer structure, gate wiring and a gate pad are provided on a front surface of a semiconductor substrate (semiconductor wafer) thereof and are electrically insulated from the semiconductor substrate by an insulation layer that covers the front surface of the semiconductor substrate. In a single chip, gate electrodes of all unit cells (constituent units of a device) thereof are electrically connected to the gate pad via the gate wiring (for example, refer to Japanese Laid-Open Patent Publication No. 2020-136315 and Japanese Laid-Open Patent Publication No. 2019-161181).

SUMMARY OF THE INVENTION

According to an embodiment of the invention, a silicon carbide semiconductor device having a built-in gate resistor, the silicon carbide semiconductor device includes: a semiconductor substrate containing silicon carbide and having an active region center portion and an active region peripheral portion different from the active region center portion, the semiconductor substrate having a first main surface and a second main surface opposite to each other; a first semiconductor region of a first conductivity type, provided in the semiconductor substrate; a device structure provided in the active region center portion and having, at the first main surface of the semiconductor substrate, an insulated gate with a metal-oxide film-semiconductor (MOS) three-layer structure, a main current flowing through the device structure in a direction orthogonal to the first main surface of the semiconductor substrate, the insulated gate having a plurality of gate electrodes that constitute a metal of the insulated gate; a second semiconductor region of a second conductivity type, provided in the semiconductor substrate and in the active region peripheral portion thereof, between the first main surface of the semiconductor substrate and the first semiconductor region, to thereby form a pn junction between the second semiconductor region and the first semiconductor region; a plurality of polysilicon layers provided in the active region peripheral portion, at the first main surface of the semiconductor substrate via an insulating film, the plurality of polysilicon layers facing the second semiconductor region in a depth direction with the insulating film intervening therebetween; an interlayer insulating film provided at the first main surface of the semiconductor substrate, the interlayer insulating film covering the device structure and the plurality of polysilicon layers; a gate pad provided on the interlayer insulating film and electrically connected to the plurality of gate electrodes; a first electrode provided at the first main surface of the semiconductor substrate and apart from the gate pad, the first electrode being electrically connected to the device structure and the second semiconductor region; and a second electrode provided at the second main surface of the semiconductor substrate. The plurality of polysilicon layers includes: a first polysilicon layer connected to the plurality of gate electrodes, a second polysilicon layer facing the first polysilicon layer via the interlayer insulating film in a direction parallel to the first main surface of the semiconductor substrate and facing the gate pad via the interlayer insulating film in the depth direction, and a third polysilicon layer electrically connecting the first polysilicon layer and the gate pad, the third polysilicon layer being connected in series to the plurality of gate electrodes via the first polysilicon layer, and connecting the first polysilicon layer and the second polysilicon layer, a portion of the third polysilicon layer constituting the gate resistor. The silicon carbide semiconductor device further includes a third electrode provided on the interlayer insulating film and fixed to a potential lower than that of the second electrode when the pn junction is reverse biased, the third electrode covering the interlayer insulating film between the first polysilicon layer and the second polysilicon layer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a cross-sectional view depicting a structure along cutting line A-A' in FIG. 1.

FIG. 6 is an enlarged plan view of a portion of a layout when a silicon carbide semiconductor device according to a second embodiment is viewed from the front side of the semiconductor substrate thereof.

FIG. 9 is an enlarged plan view of a vicinity of the built-in gate resistor Rg depicted in FIG. 8.

FIG. 10 is a cross-sectional view along cutting line D-D' in FIG. 8.

FIG. 13 is a cross-sectional view depicting the structure of the silicon carbide semiconductor device according to the fourth embodiment.

FIG. 14 is a cross-sectional view depicting the structure of the silicon carbide semiconductor device according to the fourth embodiment.

FIG. 15 is a cross-sectional view depicting the structure of the silicon carbide semiconductor device according to the fourth embodiment.

FIG. 19 is a cross-sectional view depicting the structure along cutting line AA-AA' in FIG. 18.

FIG. 20 is a cross-sectional view depicting the structure along cutting line BB-BB' in FIG. 18.

DETAILED DESCRIPTION OF THE INVENTION

Figure 1:
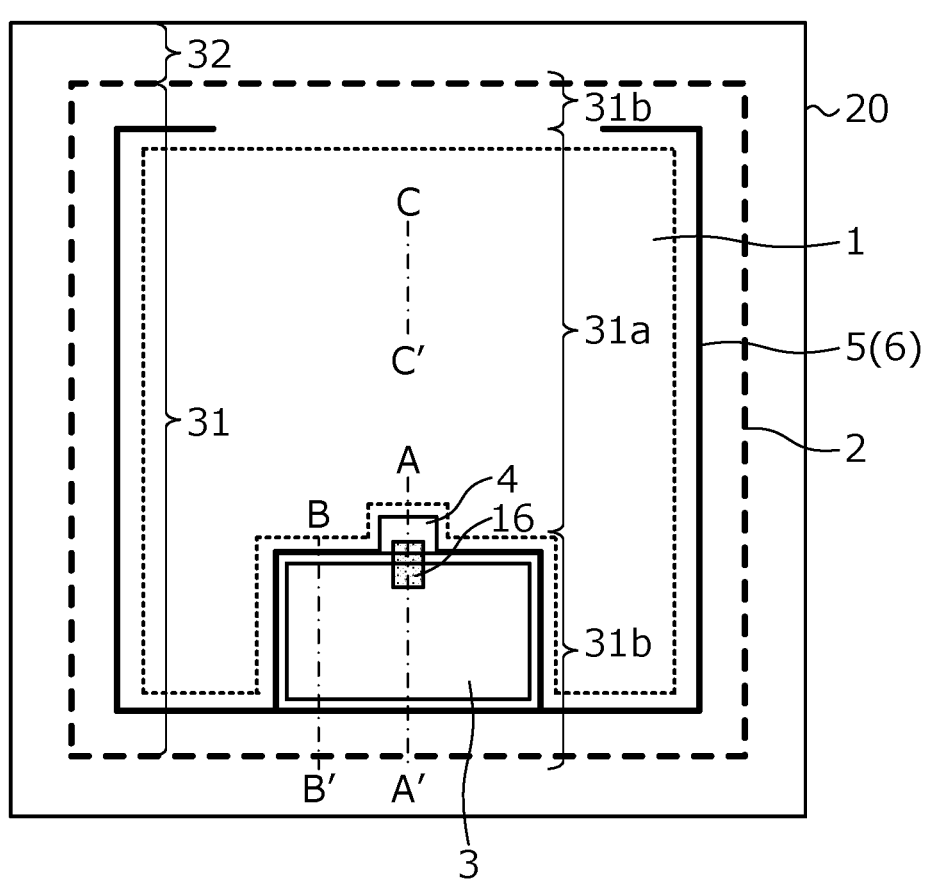
FIG. 1 is a plan view depicting a layout when a silicon carbide semiconductor device according to a first embodiment is viewed from a front side of a semiconductor substrate thereof.

First, problems associated with the conventional techniques are discussed. In Japanese Laid-Open Patent Publication No. 2020-136315, gate resistance is not built into the semiconductor chip and thus, as the number of semiconductor chips connected in parallel increases, parasitic component differences between semiconductor chips tend to become larger. In Japanese Laid-Open Patent Publication No. 2019-161181, a gate resistor formed by polysilicon (poly-Si) layers is built into the semiconductor chip, whereby a polysilicon layer directly beneath the gate pad and a polysilicon layer of the gate wiring face each other in a direction parallel to the front surface of the semiconductor chip with the insulation layering intervening therebetween and when potential rises, electric field concentrates at the insulation layer between the polysilicon layers and dielectric breakdown may occur.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

When silicon carbide (SiC) is used as a semiconductor material, defect density in the semiconductor chip is high as compared to an instance in which silicon (Si) is used as a semiconductor material and as the chip size (outer diameter dimension of the semiconductor chip) increases, yield decreases. Thus, in a silicon carbide semiconductor module, the diameter of semiconductor chips to be mounted is reduced to suppress decreases in the number of conforming products and a predetermined current capacity is ensured by a large number of the semiconductor chips connected in parallel. Nonetheless, as the number of semiconductor chips connected in parallel increases, the parasitic component differences between semiconductor chips tends to increase. Parasitic components are parasitic inductance and/or parasitic capacitance of wiring (copper foil patterning on a mounting board, etc.) connecting the semiconductor chips to each other.

When parasitic component differences between semiconductor chips are large, switching times differ between the semiconductor chips, current becomes unbalanced, and current concentrates at devices with shorter switching times. Further, oscillation of the current waveform during switching transients (abrupt current change di/dt per unit time) may cause voltage applied to the parasitic inductance of each wire to vary, thereby, leading to device failure. It is known that as a measure to decrease occurrences of the current becoming unbalanced and/or to suppress oscillation of the current waveform, a gate resistor Rg is built into each of the semiconductor chips and in each of the semiconductor chips, the resistance value of each built-in gate resistor Rg is adjusted, whereby parasitic component differences between semiconductor chips connected in parallel are reduced.

Figure 18:
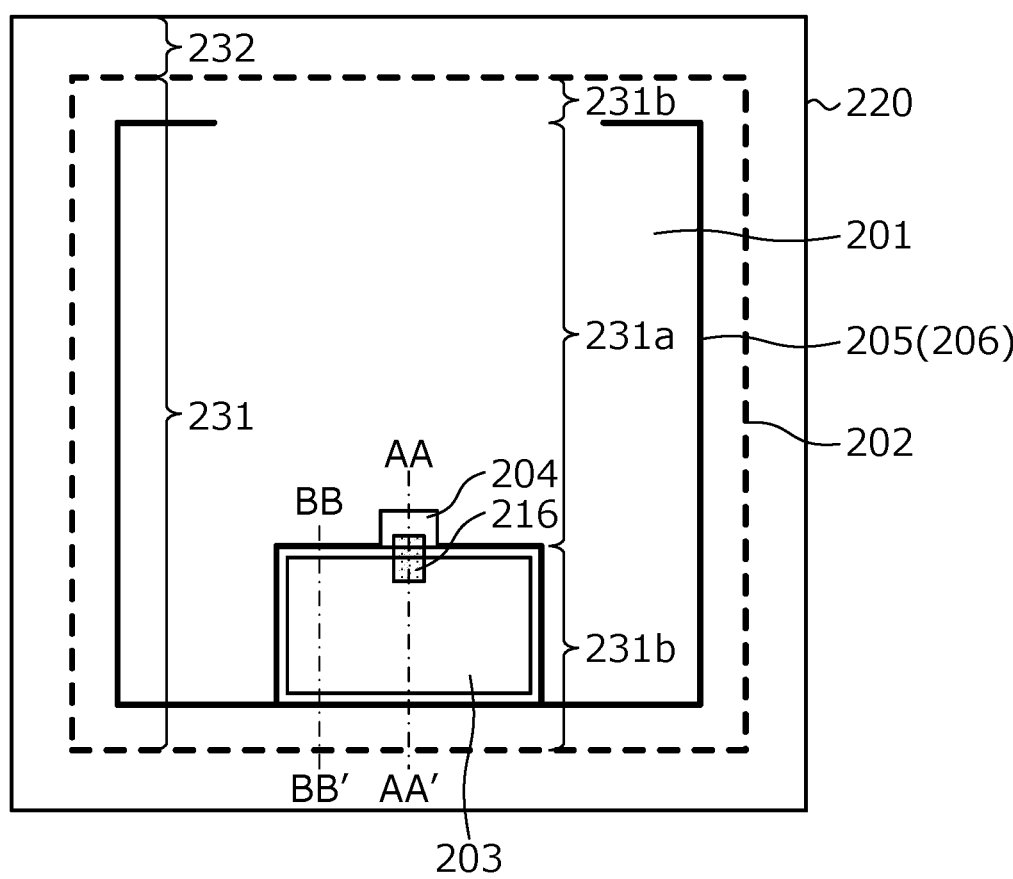
FIG. 18 is a plan view depicting a layout when a silicon carbide semiconductor device of a comparison example is viewed from a front side of a semiconductor substrate thereof.
Figure 19:
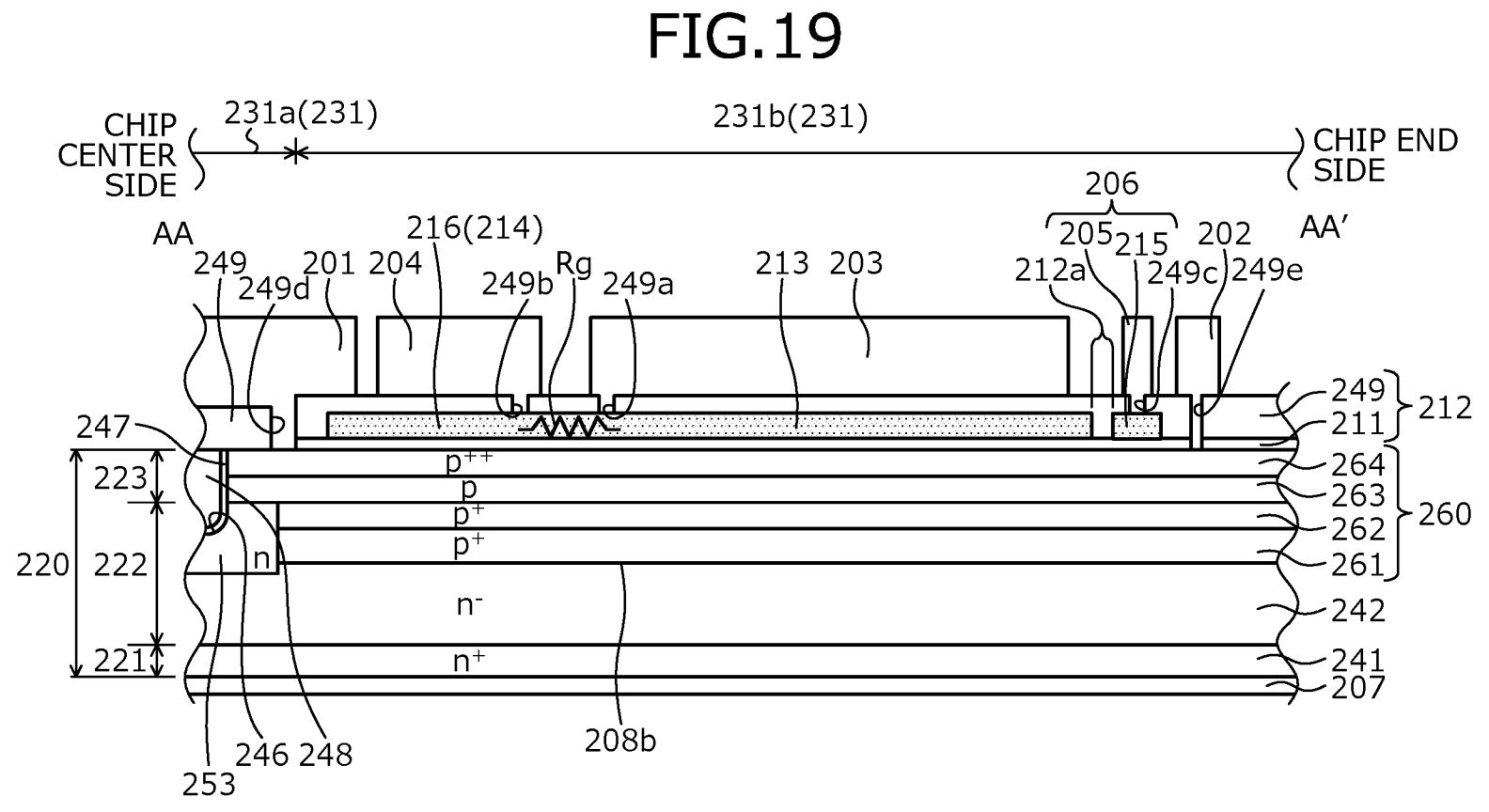
Figure 20:
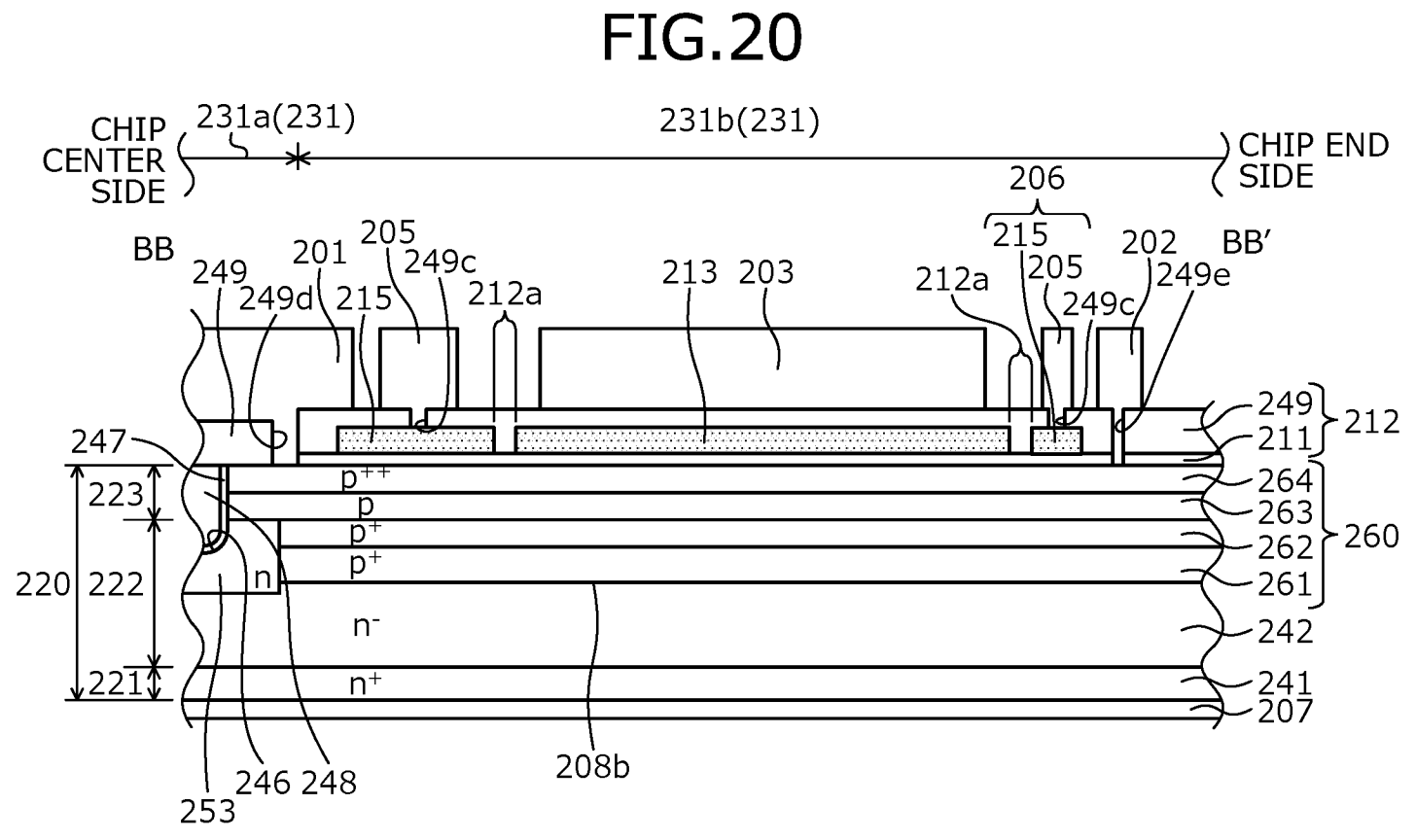

As for a structure of a silicon carbide semiconductor device of a comparison example having the built-in gate resistor Rg, description is given with reference to FIGS. 18 to 20 and a metal oxide semiconductor field effect transistor (MOSFET) with an insulated gate having a metal-oxide film-semiconductor (MOS) three-layer structure is described as an example. FIG. 18 is a plan view depicting a layout when the silicon carbide semiconductor device of the comparison example is viewed from a front side of a semiconductor substrate thereof. FIGS. 19 and 20 are cross-sectional views depicting the structure along cutting line AA-AA' and cutting line BB-BB' in FIG. 18, respectively.

In FIG. 18, metal layers (a source electrode 201, a source ring 202, a gate pad 203, a Rg measuring pad 204, and a gate metal wiring layer 205) on a front surface of a semiconductor substrate 220 and a polysilicon layer 216 (hatched portion) constituting the built-in gate resistor Rg are depicted while other polysilicon layers 213, 214, and 215 excluding the polysilicon layer 216 are not depicted. In FIG. 18, the source ring 202 is indicated by a bold dashed line, the gate metal wiring layer 205 is indicated by a bold solid line, and an outer peripheral line of the source electrode 201 is not depicted. FIGS. 19 and 20, depict a vicinity of the gate pad 203 in an active region peripheral portion 231b.

A silicon carbide semiconductor device 210 of the comparison example depicted in FIGS. 18 to 20 has, in an active region 231 thereof, the source electrode (source pad) 201, the source ring 202, the gate pad 203, the Rg measuring pad 204, and the gate metal wiring layer 205 provided on a front surface of the semiconductor substrate (semiconductor chip) 220, which contains SiC. In an active region center portion 231a, multiple unit cells (constituent units of a device, not depicted) each having the same MOSFET structure are disposed adjacent to one another. The active region center portion 231a is a region through which a main current flows when the MOSFET is in an on-state and occupies most of the area (surface area) of the semiconductor substrate 220.

The active region center portion 231a, in a device plan view, has a substantially rectangular shape and is provided in a center of the semiconductor substrate 220. The active region peripheral portion 231b surrounds a periphery of the active region center portion 231a in a substantially rectangular shape in a device plan view. In the active region peripheral portion 231b, unit cells of the MOSFET are not disposed and a later-described p-type peripheral region 260 is provided in an entire area of a surface region of the semiconductor substrate 220, at the front surface of the semiconductor substrate 220. A region between the active region 231 and an end (chip end) of the semiconductor substrate 220 is an edge termination region 232 in which a predetermined voltage withstanding structure is disposed.

The source electrode 201, the source ring 202, the gate pad 203, the Rg measuring pad 204, and the gate metal wiring layer 205 are metal layers disposed at a same level. The source electrode 201 has a substantially rectangular shape in a device plan view and covers an entire area of the active region center portion 231a. The source ring 202, the gate pad 203, the Rg measuring pad 204, and the gate metal wiring layer 205 are disposed in the active region peripheral portion 231b. The source ring 202 extends along an outer periphery of the active region peripheral portion 231b and surrounds a periphery of the source electrode 201 in a substantially rectangular shape in a device plan view. A potential of the source ring 202 is fixed at a potential of the source electrode 201.

The gate pad 203, the Rg measuring pad 204, and the gate metal wiring layer 205 are disposed between the source electrode 201 and the source ring 202 and are apart from these metal layers. The gate pad 203 and the Rg measuring pad 204 have, in a device plan view, a substantially rectangular shape and a smaller area than that of the source electrode 201. The Rg measuring pad 204 is disposed on a path of the gate metal wiring layer 205, in a vicinity of the gate pad 203, apart from the gate pad 203. The Rg measuring pad 204 is electrically connected to the gate pad 203 via the polysilicon (poly-Si) layer 216.

The gate metal wiring layer 205 extends along an inner periphery of the active region peripheral portion 231b and surrounds the periphery of the source electrode 201 in a substantially rectangular shape in a device plan view. Further, the gate metal wiring layer 205 is disposed apart from the gate pad 203 and surrounds a periphery of the gate pad 203 in a substantially rectangular shape in a device plan view. The gate metal wiring layer 205 is electrically connected to the gate pad 203 via the polysilicon layer 215, 216 (refer to FIGS. 19 and 20). The gate metal wiring layer 205 is directly connected to the Rg measuring pad 204. The gate metal wiring layer 205 and the polysilicon layer 215 constitute a gate runner (gate wiring) 206.

As depicted in FIGS. 19 and 20, the semiconductor substrate 220 is formed by epitaxially growing, in the order stated, epitaxial layers 222, 223 constituting an $n^-$-type drift region 242 and a p-type base region (not depicted), on an $n^+$-type starting substrate 221 containing SiC. The semiconductor substrate 220 has, as the front surface, a first main surface having the epitaxial layer 223 and, as a back surface, a second main surface having the $n^+$-type starting substrate 221. The $n^+$-type starting substrate 221 constitutes an $n^+$-type drain region 241. In the semiconductor substrate 220, at the front surface thereof, a trench gate structure (not depicted) and the source electrode 201 are provided in the active region center portion 231a.

In the active region peripheral portion 231b, in an entire region between the front surface of the semiconductor substrate 220 and the $n^-$-type drift region 242, the p-type peripheral region 260 is provided in contact with the $n^-$-type drift region 242. The p-type peripheral region 260 is in contact with an insulation layer 212 at the front surface of the semiconductor substrate 220. The p-type peripheral region 260 surrounds the periphery of the active region center portion 231a. The p-type peripheral region 260 has an inner peripheral side (side facing the center of the semiconductor substrate 220) and an outer peripheral side (side facing the end of the semiconductor substrate 220) and along an entire area of the inner peripheral side, is in contact with the source electrode 201 while along an entire area of the outer peripheral side, is in contact with the source ring 202 and thereby, is fixed to the potential of the source electrode 201.

The p-type peripheral region 260 has a layered structure in which $p^+$-type outer peripheral regions 261, 262, a $p^+$-type base extension 263, and a $p^{++}$-type outer peripheral contact region 264 are adjacent to one another sequentially in a direction from the $n^-$-type drift region 242 to the front surface of the semiconductor substrate 220. The $p^+$-type outer peripheral regions 261, 262 are formed concurrently with $p^+$-type regions that are for mitigating electric field and that are in a vicinity of bottoms of gate trenches (not depicted) configuring the trench gate structure. The $p^+$-type base extension 263 is an extended portion of a $p^+$-type base region (not depicted) configuring the trench gate structure. The $p^{++}$-type outer peripheral contact region 264 is formed concurrently with a $p^{++}$-type contact region (not depicted) configuring the trench gate structure.

In the edge termination region 232 and the active region peripheral portion 231b, an entire area of the front surface of the semiconductor substrate 220 is covered by the insulation layer 212. The insulation layer 212 is formed by sequentially stacking, in the order stated, a field oxide film 211 and an interlayer insulating film 249. In the active region peripheral portion 231b, the polysilicon (poly-Si) layers 213 to 216 are of a substantially equal thickness and provided at a same level in the insulation layer 212. Each of the polysilicon layers 213 to 216 is provided on the front surface of the semiconductor substrate 220 via the field oxide film 211 and has an upper surface and side surfaces covered by the interlayer insulating film 249.

The polysilicon layer 213 has, in a device plan view, a substantially rectangular shape with an outer diameter dimension larger than that of the gate pad 203; the polysilicon layer 213 faces an entire area of a surface of the gate pad 203 in a depth direction, via the interlayer insulating film 249. The polysilicon layer 214 has, in a device plan view, a substantially rectangular shape with an outer diameter dimension larger than that of the Rg measuring pad 204; the polysilicon layer 214 faces at least substantially an entire outer periphery of the Rg measuring pad 204 in the depth direction via the interlayer insulating film 249. The polysilicon layer 214 is configured by portions of the polysilicon layers 215, 216, extending directly beneath (side facing the semiconductor substrate 220) the Rg measuring pad 204.

The polysilicon layer 215 is a gate polysilicon wiring layer configuring the gate runner 206. The polysilicon layer 215 is connected to the gate electrodes (not depicted) of all the unit cells of the MOSFET, disposed in the active region center portion 231a. The polysilicon layer 215 extends in a layout substantially the same as that of the gate metal wiring layer 205 and faces the gate metal wiring layer 205 overall in a depth direction Z. In particular, the polysilicon layer 215 surrounds the periphery of the active region center portion 231a in a substantially rectangular shape in a device plan view, is apart from the polysilicon layer 213 directly beneath the gate pad 203, and surrounds the polysilicon layer 213 in a substantially rectangular shape in a device plan view.

Further, the polysilicon layer 215 is connected to the polysilicon layer 216, directly beneath the Rg measuring pad 204. The polysilicon layer 215 faces the polysilicon layer 213 in a direction parallel to the front surface of the semiconductor substrate 220 with the interlayer insulating film 249 (the insulation layer 212) intervening therebetween. In a vicinity of the gate pad 203, the polysilicon layer 216 is disposed between the polysilicon layers 213, 215 that are adjacent to each other and extends linearly between the polysilicon layers 213, 215. Ends of the polysilicon layer 216 in a longitudinal direction thereof are connected to the polysilicon layers 213, 215, respectively.

The polysilicon layer 216 is connected to the gate pad 203 and the Rg measuring pad 204 at contact holes 249a, 249b of the interlayer insulating film 249, respectively. In the polysilicon layer 216, a portion thereof between respective contacts (connection portions) of the gate pad 203 and the Rg measuring pad 204 constitutes the built-in gate resistor Rg. As described, the built-in gate resistor Rg formed by the polysilicon layer 216 is disposed, whereby the polysilicon layer 215 of the gate runner 206 and the polysilicon layer 213 directly beneath the gate pad 203 are apart from each other with the insulation layer 212 intervening therebetween and face each other in a direction parallel to the front surface of the semiconductor substrate 220, with the insulation layer 212 intervening therebetween.

In the active region peripheral portion 231b, the source electrode 201 extends on the insulation layer 212, from the active region center portion 231a. The source electrode 201 is connected to an inner peripheral portion of the $p^{++}$-type outer peripheral contact region 264 via a contact hole 249d of the interlayer insulating film 249. An outer peripheral portion of the source electrode 201 faces the polysilicon layer 215 in the depth direction Z with the interlayer insulating film 249 intervening therebetween. In the active region peripheral portion 231b, the source ring 202, the gate pad 203, the Rg measuring pad 204, and the gate metal wiring layer 205 are provided on the insulation layer 212.

The source ring 202 is connected to an outer peripheral portion of the $p^{++}$-type outer peripheral contact region 264 via a contact hole 249e of the insulation layer 212. The gate pad 203 and the Rg measuring pad 204 are connected to the polysilicon layer 216 via the contact holes 249a, 249b of the interlayer insulating film 249, respectively. On a path of the gate metal wiring layer 205, the Rg measuring pad 204 is disposed close to the gate pad 203 and is connected directly to the gate metal wiring layer 205. The gate metal wiring layer 205 is connected to the polysilicon layer 215 via a contact hole 249c of the interlayer insulating film 249.

In the insulation layer 212, a portion 212a thereof between the polysilicon layer 215 of the gate runner 206 and the polysilicon layer 213 directly beneath the gate pad 203 separates the polysilicon layers 213, 215 from each other and is not covered by any of the metal layer. Through earnest research by the inventor, it was confirmed that at the portion 212a separating the polysilicon layers 213, 215 from each other, electric field concentrates when potential rises in the insulation layer 212, and dielectric breakdown occurs (refer to pattern 1 in later-described FIG. 17A). In the present embodiment, in a silicon carbide semiconductor device having the built-in gate resistor Rg formed by a polysilicon layer, prevention of dielectric breakdown is given as one problem to be solved.

A structure of a silicon carbide semiconductor device according to a first embodiment is described. FIG. 1 is a plan view depicting a layout when the silicon carbide semiconductor device according to the first embodiment is viewed from a front side of a semiconductor substrate thereof. In FIG. 1, metal layers (a source electrode 1, a source ring 2, a gate pad 3, an Rg measuring pad 4, and a gate metal wiring layer 5) on a front surface of a semiconductor substrate 20 and a polysilicon layer (hatched portion) 16 that configures the built-in gate resistor Rg are depicted while polysilicon layers 13, 14, 15 are not depicted. In FIG. 1, the source electrode 1 is indicated by a dashed line, the source ring 2 is indicated by a bold dashed line, and the gate metal wiring layer 5 is indicated by a bold solid line.

Figure 2:
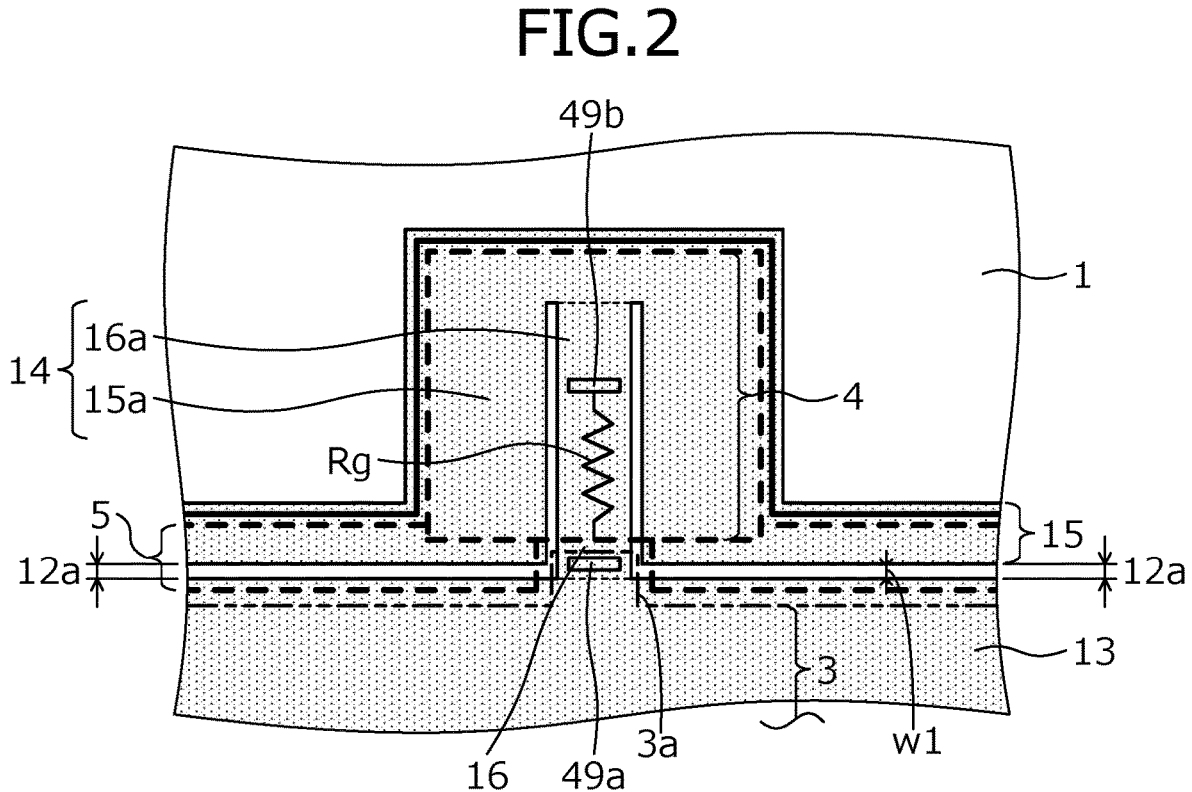
FIG. 2 is an enlarged plan view of a vicinity of a built-in gate resistor Rg in FIG. 1.

FIG. 2 is an enlarged plan view of a vicinity of the built-in gate resistor Rg in FIG. 1. In FIG. 2, the polysilicon layers 13 to 16 are indicated by the same hatching, a connection between the polysilicon layer 16 configuring the built-in gate resistor Rg and the polysilicon layer 13 directly beneath the gate pad 3, and a connection between the polysilicon layer 16 configuring the built-in gate resistor Rg and the polysilicon layer 15 of a gate runner 6 are each indicated by a dashed line. In FIG. 2, a portion (portion facing the Rg measuring pad 4 and the gate metal wiring layer 5) of an outer periphery of the source electrode 1 is indicated by a bold solid line while outer peripheries of the gate metal wiring layer 5 and the Rg measuring pad 4 are indicated by bold dashed lines and the gate pad 3 is indicated by a two-dot chain line.

Figure 3:
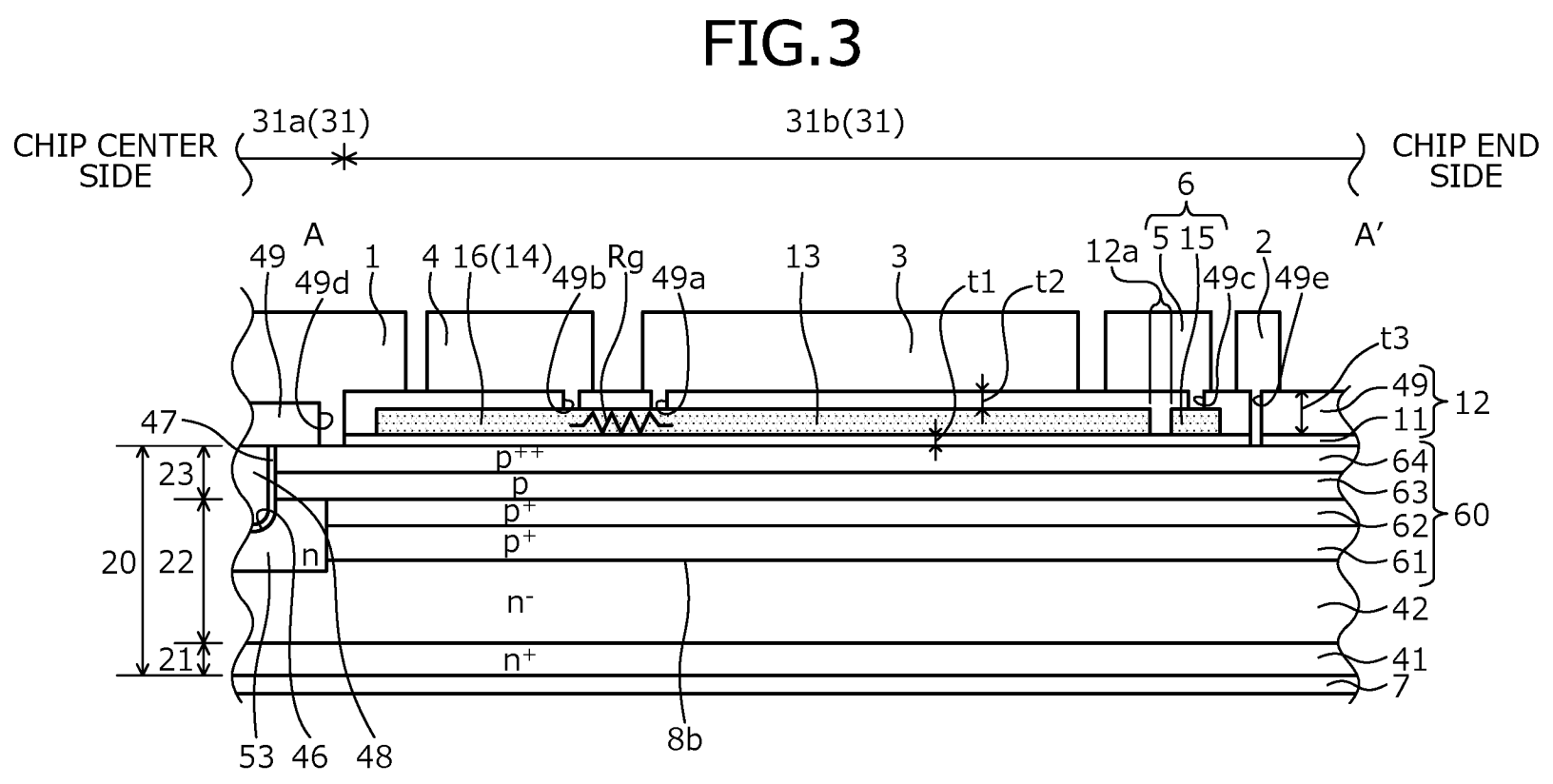
Figure 4:
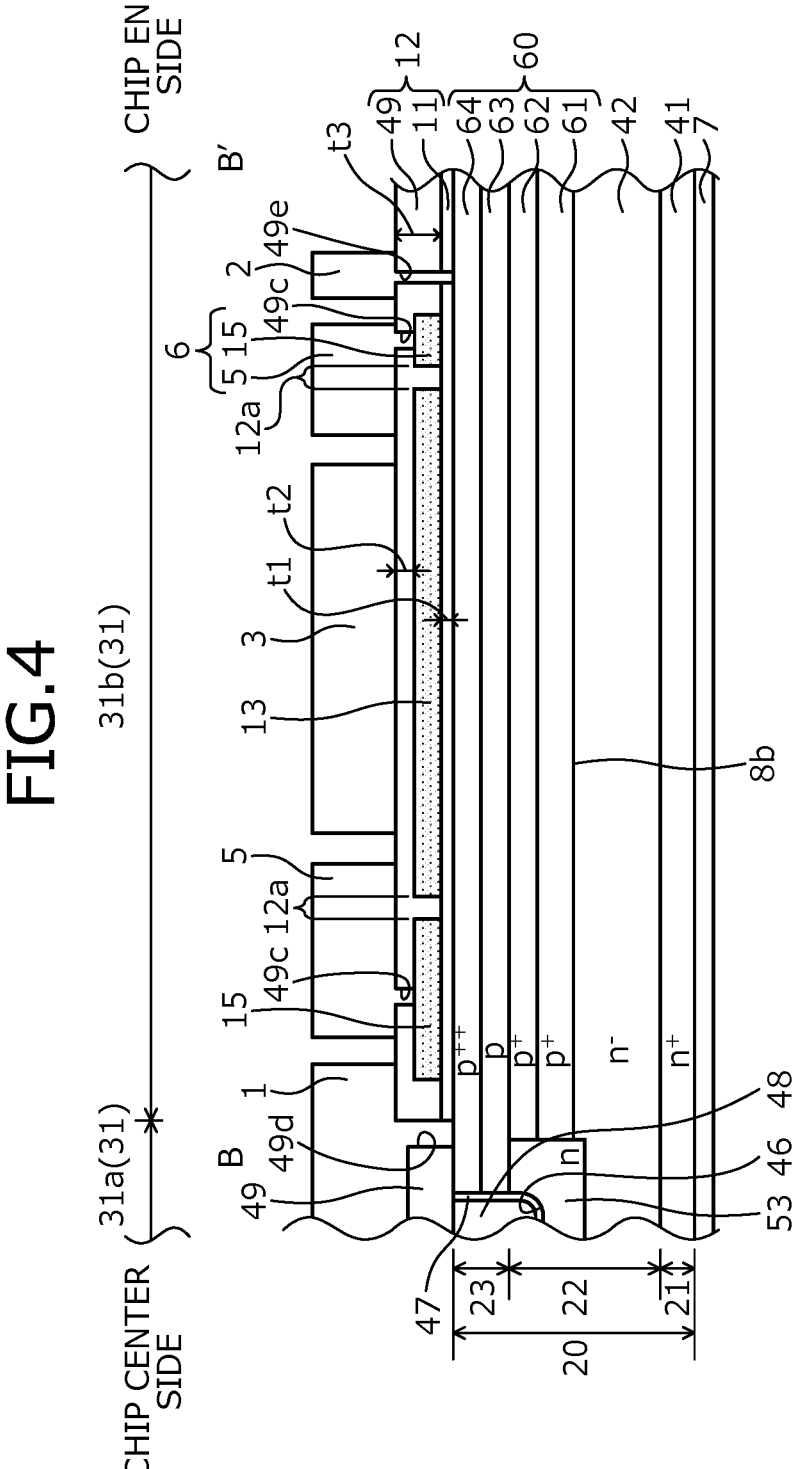
FIG. 4 is a cross-sectional view depicting the structure along cutting line B-B' in FIG. 1.
Figure 5:
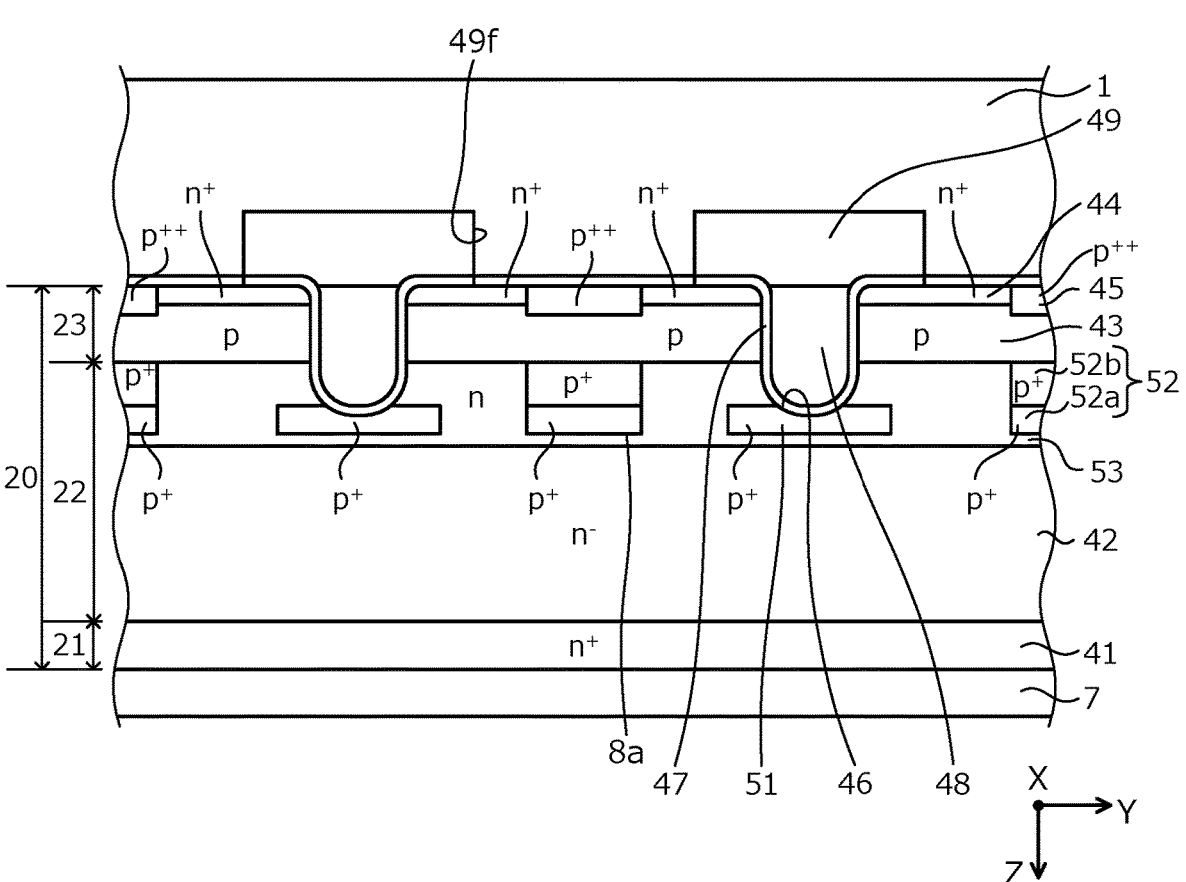
FIG. 5 is a cross-sectional view depicting the structure along cutting line C-C' in FIG. 1.

FIGS. 3, 4, and 5 are cross-sectional views depicting the structure along cutting line A-A', cutting line B-B', and cutting line C-C' in FIG. 1, respectively. In FIGS. 3 and 4, a vicinity of the gate pad 3 in an active region peripheral portion 31b is depicted and in FIG. 5, two unit cells of multiple unit cells disposed adjacent to one another in an active region center portion 31a are depicted. A silicon carbide semiconductor device 10 according to the first embodiment depicted in FIGS. 1 to 5 is a MOSFET having, in an active region 31, the source electrode (first electrode) 1, the source ring 2, the gate pad 3, the Rg measuring pad 4, and the gate metal wiring layer 5 on a front surface of a semiconductor substrate (semiconductor chip) 20 that contains silicon carbide (SiC).

As depicted in FIG. 1, the active region 31 has a substantially rectangular shape in a device plan view and is provided in substantially a center of the semiconductor substrate 20. The active region 31 is a portion from an outer end (end facing the end of the semiconductor substrate 20) of a later-described p-type peripheral region (second semiconductor region) 60 inward (direction to the center of the semiconductor substrate 20). A center portion of the active region 31 is the active region center portion 31a through which a main current flows when the MOSFET is in an on-state and in which multiple unit cells each having a same MOSFET structure are disposed adjacent to one another. The active region center portion 31a is a portion farther inward than is an outer sidewall of a later-described contact hole 49d that forms a contact between the source electrode 1 and an inner peripheral portion of a $p^{++}$-type outer peripheral contact region 64, the outer sidewall of the contact hole 49d is a sidewall thereof closest to the chip end.

The active region peripheral portion 31b is a portion that is free of the unit cells of the MOSFET. The active region peripheral portion 31b is provided outside but adjacent to the active region center portion 31a, surrounding a periphery of the active region center portion 31a in a substantially rectangular shape in a device plan view. In an entire portion of the semiconductor substrate 20, at the front surface thereof in the active region peripheral portion 31b, the p-type peripheral region 60 is provided. A region between the active region 31 and the end (the chip end) of the semiconductor substrate 20 is an edge termination region 32. The edge termination region 32 is adjacent to the active region peripheral portion 31b and is exposed at a side surface of the semiconductor substrate 20.

The edge termination region 32 is formed so as to surround a periphery of the active region peripheral portion 31b. Further, in the edge termination region 32, at the front surface of the semiconductor substrate 20, an n⁻-type drift region 42 may be exposed while at a border between the active region peripheral portion 31b and the edge termination region 32, a step (not depicted) may be formed such that the front surface of the semiconductor substrate 20 in the edge termination region 32 is closer to an n⁺-type drain region 41 than that in the active region 31.

The edge termination region 32 has a function of mitigating electric field of the front side of the semiconductor substrate 20 and sustaining a breakdown voltage, in a later-described n⁻-type drift region 42 (first semiconductor region, refer to FIGS. 3 to 5) in the active region peripheral portion 31b. The breakdown voltage is a voltage limit at which leakage current does not increase excessively and no malfunction or destruction of the device occurs. In the edge termination region 32, a predetermined voltage withstanding structure such as a mesa structure, a junction termination extension (JTE) structure, a field limiting ring (FLR), etc. is disposed. The FLR, the JTE structure, etc. are formed between the n⁻-type drift region 42 and the front surface of the semiconductor substrate 20 in the edge termination region 32.

The source electrode 1, the source ring 2, the gate pad 3, the Rg measuring pad 4, and the gate metal wiring layer 5 are formed concurrently by patterning (etching) of a metal layer deposited on an interlayer insulating film 49 (refer to FIGS. 3 to 5) and thus, are metal layers disposed at the same level as one another. An interval between these metal layers disposed at the same level is at least a minimum machining limit for etching (minimum opening width) and preferably, may be as narrow as possible. The source electrode 1, for example, has a substantially rectangular shape that has a portion recessed toward a chip center (center of the semiconductor substrate 20) in a device plan view, the source electrode 1 covering an entire area of the active region center portion 31a. A portion of the source electrode 1 exposed in an opening of a passivation film (not depicted) functions as the source pad. Potential of the source electrode 1 is the lowest potential in the semiconductor substrate 20 (for example, ground potential=0V).

The source ring 2, the gate pad 3, the Rg measuring pad 4, and the gate metal wiring layer 5 are disposed in the active region peripheral portion 31b. The source ring 2 extends in a substantially rectangular shape along an outer periphery of the active region peripheral portion 31b in a device plan view, is apart from the source electrode 1, and surrounds the periphery of the source electrode 1. The source ring 2 has the potential (source potential) of the source electrode 1. The source ring 2 is connected to the source electrode 1 at an arbitrary location and the potential is stable in an entire area of the source ring 2. The gate pad 3, the Rg measuring pad 4, and the gate metal wiring layer 5 are disposed between the source electrode 1 and the source ring 2, apart from these metal layers of the source potential.

The gate pad 3 has, in a device plan view, a substantially rectangular shape having an area smaller than that of the source electrode 1. The gate pad 3 may have a substantially rectangular shape with a portion (hereinafter, protrusion) 3a at a side surface (side) thereof facing the Rg measuring pad 4, the protrusion 3a protruding toward the Rg measuring pad 4. In this instance, the gate pad 3, at the protrusion 3a thereof, faces and is electrically connected to the later-described polysilicon layer 16 in the depth direction Z. The protrusion 3a of the gate pad 3 may protrude so as to cover at least a later-described contact hole 49a constituting a contact (connection) with the polysilicon layer 16 and may further face the polysilicon layer 15 in the depth direction Z. The potential of the gate pad 3 is lower than voltage applied to a drain electrode 7 during operation of the silicon carbide semiconductor device 10 and is in a range of, for example, about −20V to +20V.

The Rg measuring pad 4 has a substantially rectangular shape that has an area smaller than that of the gate pad 3 in a device plan view. The Rg measuring pad 4 is disposed on a path of the gate runner 6, in a vicinity of the gate pad 3 but apart from the gate pad 3. For example, FIG. 1 depicts an instance in which the gate pad 3 is disposed in the recessed portion of the source electrode 1 and at the recessed portion of the source electrode 1, the Rg measuring pad 4 is disposed between the source electrode 1 and the gate pad 3. The Rg measuring pad 4 may be disposed between the source ring 2 and the gate pad 3. The Rg measuring pad 4 is electrically connected to the gate pad 3 via the polysilicon layer 16.

The gate metal wiring layer 5 extends along the inner periphery of the active region peripheral portion 31b and surrounds the periphery of the source electrode 1 in a substantially rectangular shape having an open portion, in a device plan view. For example, the source electrode 1 and the source ring 2 are connected by the open portion of the gate metal wiring layer 5. Further, the gate metal wiring layer 5 is disposed apart from the gate pad 3 and surrounds the periphery of the gate pad 3 in a substantially rectangular shape in a device plan view. The gate metal wiring layer 5 is electrically connected to the gate pad 3 via the later-described polysilicon layers 15, 16. The gate metal wiring layer 5 may be connected directly to the Rg measuring pad 4 or may be electrically connected to the Rg measuring pad 4 via the later-described polysilicon layer 15.

The gate metal wiring layer 5 and the later-described polysilicon layer 15 configure the gate runner (gate wiring) 6. The gate runner 6, as described hereinafter, is electrically connected to the gate pad 3 via the built-in gate resistor Rg (the polysilicon layer 16) and thus, has a potential that is lower than that of the gate pad 3 by an amount equivalent to a voltage drop at the built-in gate resistor Rg. The gate runner 6 has a function of suppressing variations in the propagation time of gate signals to each unit cell in the same chip. The gate runner 6 is provided, whereby at a location apart from the gate pad 3, delay of gate signals to the unit cells may be suppressed.

As depicted in FIGS. 3 to 5, the semiconductor substrate 20 is formed by sequentially forming, in the stated order, epitaxial layers 22, 23 on a front surface of an n⁺-type starting substrate 21 containing SiC; the epitaxial layers 22, 23 constitute the n⁻-type drift region 42 and a p-type base region 43, respectively. The semiconductor substrate 20 has, as the front surface, a first main surface having the epitaxial layer 23 and, as a back surface, a second main surface having the n⁺-type starting substrate 21 (back surface of the n⁺-type starting substrate 21. The n⁺-type starting substrate 21 constitutes the n⁺-type drain region 41. In the active region center portion 31a, at the front side of the semiconductor substrate 20, unit cells of the trench gate structure (device structure) are provided adjacently to one another.

The trench gate structure is configured by the p-type base region 43, n⁺-type source regions 44, p⁺⁺-type contact regions 45, trenches 46, gate insulating films 47, and gate electrodes 48. The p-type base region 43 is provided in an entire area between the front surface of the semiconductor substrate 20 and the n⁻-type drift region 42, in the active region 31. The n⁺-type source regions 44 and the p⁺⁺-type contact regions 45 are diffused regions formed in the epitaxial layer 23 of a p-type (hereinafter, may be indicated as "the p-type epitaxial layer 23") by ion implantation. A portion of the p-type epitaxial layer 23 excluding the n$^+$-type source regions 44, the p$^{++}$-type contact regions 45, and the later-described p$^{++}$-type outer peripheral contact region 64 constitutes the p-type base region 43.

The n$^+$-type source regions 44 and the p$^{++}$-type contact regions 45 are selectively provided between the front surface of the semiconductor substrate 20 and the p-type base region 43; each has a lower surface (surface facing the n$^+$-type drain region 41) in contact with the p-type base region 43. The n$^+$-type source regions 44 and the p$^{++}$-type contact regions 45 are in ohmic contact with the source electrode 1 at the front surface of the semiconductor substrate 20. The n$^+$-type source regions 44 are in contact with the gate insulating films 47 at sidewalls of the trenches 46. The p$^{++}$-type contact regions 45, for example, are scattered in the longitudinal direction (a later-described first direction X) of the trenches 46, substantially centered between any adjacent two of the trenches 46; peripheries of the p$^{++}$-type contact regions 45 are each surrounded by the n$^+$-type source regions 44.

The p$^{++}$-type contact regions 45 may be omitted. In an instance in which the p$^{++}$-type contact regions 45 are omitted, instead of the p$^{++}$-type contact regions 45, the p-type base region 43 is in ohmic contact with the source electrode 1, at the front surface of the semiconductor substrate 20. Between the n$^-$-type drift region 42 and the p-type base region 43 in the active region 31, p$^+$-type regions 51, 52 and an n-type current spreading region 53 are each selectively provided at depth positions closer to the n$^+$-type drain region 41 than are bottoms of the trenches 46. The p$^+$-type regions 51, 52 and the n-type current spreading region 53 are diffused regions formed in the epitaxial layer 22 of an n$^-$-type (hereinafter, may be indicated as "n$^-$-type epitaxial layer 22") by ion implantation.

A portion of the n$^-$-type epitaxial layer 22 excluding the p$^+$-type regions 51, 52, the n-type current spreading region 53, and later-described p$^+$-type outer peripheral regions 61, 62 constitutes the n$^-$-type drift region 42. The p$^+$-type regions 51, 52 are fixed to the potential of the source electrode 1 and have a function of depleting (or causing the n-type current spreading region 53 to deplete, or both) when the MOSFET (the silicon carbide semiconductor device 10) is off, and mitigating electric field applied to the gate insulating films 47. The p$^+$-type regions 51, 52 each extends in a stripe-shape in the longitudinal direction of the trenches 46 and is coupled to the later described p-type peripheral region 60 (the p$^+$-type outer peripheral regions 61, 62).

The p$^+$-type regions 51 are provided apart from the p-type base region 43 and face the bottoms of the trenches 46 in the depth direction Z, respectively. At the bottoms of the trenches 46, the p$^+$-type regions 51 may be in contact with the gate insulating films 47 or may be apart from the bottoms of the trenches 46. A width (width in a second direction Y that is parallel to the front surface of the semiconductor substrate 20 and orthogonal to the first direction X) of each of the p$^+$-type regions 51 is equal to a width (width in the second direction Y) of each of the trenches 46 or is wider than the width of each of the trenches 46. When the width of each of the p$^+$-type regions 51 is wider than the width of each of the trenches 46, the p$^+$-type regions 51 further face bottom corner portions (borders between sidewalls and the bottom) of each of the trenches 46 in the depth direction Z and the effect of mitigating electric field close to the bottoms of the trenches 46 is increased by the p$^+$-type regions 51.

The p$^+$-type regions 52 are each disposed substantially centered between any adjacent two of the trenches 46 and face the p$^{++}$-type contact regions 45 in the depth direction Z. The p$^+$-type regions 52 are provided apart from the trenches 46 and the p$^+$-type regions 51 and have upper surfaces (surfaces facing the n$^+$-type source regions 44) in contact with the p-type base region 43. The p$^+$-type regions 52 are formed by, for example, multi-stage epitaxial growth divided into two stages and each of the p$^+$-type regions 52 has a two-layer structure in which a lower portion (portion facing the n$^+$-type drain region 41) 52$a$ thereof and an upper portion (portion facing the n$^+$-type source regions 44) 52$b$ thereof are adjacent to each other in the depth direction Z. A multi-stage epitaxial method is a method in which at each stage of epitaxial growth of an epitaxial layer, a diffused region of a predetermined conductivity type is formed in the epitaxial layer by ion implantation.

The lower portions 52$a$ of the p$^+$-type regions 52 are formed concurrently with the p$^+$-type regions 51 and terminate at positions substantially at a same depth as that of the p$^+$-type regions 51. The lower portions 52$a$ and the upper portions 52$b$ of the p$^+$-type regions 52 may have substantially the same impurity concentration or may have differing impurity concentrations. The p$^+$-type regions 51, 52 may reach a depth at least equal to that of the n-type current spreading region 53 in a direction to the n$^+$-type drain region 41 and may be in contact with the n$^-$-type drift region 42, or peripheries of the p$^+$-type regions 51, 52 may be surrounded by the n-type current spreading region 53. The p$^+$-type regions 51, 52 adjacent to one another may be partially connected to one another in the active region center portion 31$a$. A substantially same depth position and a substantially same impurity concentration mean, respectively, the same depth position and the same impurity concentration within a range that includes an allowable error due to process variation.

The n-type current spreading region 53 is a so-called current spreading layer (CSL) that reduces carrier spreading resistance. The n-type current spreading region 53 is in contact with the p$^+$-type regions 51, 52, and the gate insulating films 47, and has an upper surface in contact with the p-type base region 43 and a lower surface in contact with the n$^-$-type drift region 42. The n-type current spreading region 53 may extend between the p-type peripheral region 60 and the n$^-$-type drift region 42. The n-type current spreading region 53 may be omitted. In this instance, instead of the n-type current spreading region 53, the n$^-$-type drift region 42 reaches the p-type base region 43, between the p$^+$-type regions 51, 52 that are adjacent to one another.

The trenches 46 penetrate through the n$^+$-type source regions 44 and the p-type base region 43 in the depth direction Z from the front surface of the semiconductor substrate 20 and reach the n-type current spreading region 53. The trenches 46 may terminate in the p$^+$-type regions 51. Each of the trenches 46 extends in a stripe-shape, in the first direction X, which is parallel to the front surface of the semiconductor substrate 20. In the trenches 46, the gate electrodes 48 are provided via the gate insulating films 47. The gate electrodes 48 are constituted by a conductive layer containing a polysilicon and are electrically connected to the gate pad 3 via a gate polysilicon wiring layer (the polysilicon layer 15) and the built-in gate resistor Rg (the polysilicon layer 16).

The interlayer insulating film 49 is provided in an entire area of the front surface of the semiconductor substrate 20 and covers the gate electrodes 48. The source electrode 1 is in ohmic contact with the n$^+$-type source regions 44 and the $p^{++}$-type contact regions 45 at the front surface of the semiconductor substrate 20 via contact holes 49*f* of the interlayer insulating film 49; the source electrode 1 is electrically connected to the $n^+$-type source regions 44, the $p^{++}$-type contact regions 45, and the p-type base region 43. The drain electrode (second electrode) 7 is provided in an entire area of the back surface of the semiconductor substrate 20. The drain electrode 7 is in ohmic contact with the back surface of the semiconductor substrate 20 and is electrically connected to the $n^+$-type drain region 41 (the $n^+$-type starting substrate 21).

In the active region peripheral portion 31*b*, between the front surface of the semiconductor substrate 20 and the $n^-$-type drift region 42, the $p^+$-type outer peripheral regions 61, 62, a p-type base extension 63, and the $p^{++}$-type outer peripheral contact region 64 are sequentially adjacent to one another in a direction from the $n^-$-type drift region 42 to the front surface of the semiconductor substrate 20. The $p^+$-type outer peripheral regions 61, 62, the p-type base extension 63, and the $p^{++}$-type outer peripheral contact region 64 configure the p-type peripheral region 60. Further, the $p^+$-type outer peripheral regions 61, 62, the p-type base extension 63, and the $p^{++}$-type outer peripheral contact region 64 may extend outward and reach the border with the edge termination region 32, from the active region center portion 31*a*.

In the edge termination region 32, the $p^{++}$-type outer peripheral contact region 64 and the p-type base extension 63 may be removed, whereby a portion of the front surface of the semiconductor substrate 20 in the edge termination region 32 becomes lower (closer to the $n^+$-type drain region 41) than is a portion thereof in the active region 31. Further, the p-type peripheral region 60 may be connected to a p-type region configuring the voltage withstanding structure of the edge termination region 32.

The $p^+$-type outer peripheral regions 61, 62 are diffused regions formed in the $n^-$-type epitaxial layer 22 by ion implantation. The $p^+$-type outer peripheral regions 61, 62, for example, are respectively formed concurrently with the lower portions 52*a* and the upper portions 52*b* of the $p^+$-type regions 52 in the active region center portion 31*a* and are adjacent to one another in the depth direction Z, between the p-type base extension 63 and the $n^-$-type drift region 42. The $p^+$-type outer peripheral regions 61, 62 are provided in an entire area between the p-type base extension 63 and the $n^-$-type drift region 42. A lower surface of the $p^+$-type outer peripheral region 61 is in contact with the $n^-$-type drift region 42. An upper surface of the $p^+$-type outer peripheral region 62 is in contact with the p-type base extension 63. The p-type base extension 63 is a portion of the p-type base region 43 and extends into the active region peripheral portion 31*b*.

The $p^{++}$-type outer peripheral contact region 64 is a diffused region formed in the p-type epitaxial layer 23 by ion implantation. The $p^{++}$-type outer peripheral contact region 64 is formed concurrently with, for example, the $p^{++}$-type contact regions 45 of the active region center portion 31*a*. The $p^{++}$-type outer peripheral contact region 64 has a function of suppressing rises in the potential of the p-type peripheral region 60 directly beneath the gate pad 3 (side of the gate pad 3 facing the semiconductor substrate 20), due to sudden rises in the voltage applied to the drain electrode 7. The surface of the $p^{++}$-type outer peripheral contact region 64 (the front surface of the semiconductor substrate 20 in the active region peripheral portion 31*b*) is covered by a field oxide film (insulating film) 11.

The $p^{++}$-type outer peripheral contact region 64, along an entire inner peripheral side thereof (side thereof facing the chip center), is in contact with the source electrode 1 via the contact hole 49*d* of the interlayer insulating film 49. The $p^{++}$-type outer peripheral contact region 64, along an entire outer side thereof (side thereof facing the chip end), is in contact with the source ring 2 via a contact hole 49*e* of an insulation layer 12. As described, the entire inner peripheral portion and the entire outer peripheral portion of the $p^{++}$-type outer peripheral contact region 64 are fixed to the potential of the source electrode 1, whereby the $p^{++}$-type outer peripheral contact region 64 has a substantially uniform potential distribution over an entire area of the p-type peripheral region 60.

The entire area of the front surface of the semiconductor substrate 20 in the active region peripheral portion 31*b* and the edge termination region 32 is covered by the insulation layer 12. The insulation layer 12 is formed by the field oxide film 11 and the interlayer insulating film 49, which are sequentially stacked on each other in the order stated. The field oxide film 11 is an oxide silicon ($SiO_2$) film formed by thermal oxidation of the semiconductor substrate 20. The interlayer insulating film 49 is an oxide silicon film such as that of a borophosphosilicate glass (BPSG) containing boron (B) and phosphorus (P), deposited by, for example, chemical vapor deposition (CVD).

A thickness t1 of the field oxide film 11 is a thickness capable of electrically insulating the semiconductor substrate 20 and the later-described polysilicon layers 13 to 16 and is, for example, about 0.1 μm or more. With consideration of an instance in which, at a border between the active region center portion 31*a* and the active region peripheral portion 31*b*, a step is formed at the front surface of the semiconductor substrate 20 whereby the portion of the front surface of the semiconductor substrate 20 in the edge termination region 32 is lower (closer to the $n^+$-type drain region 41) than is that of the active region 31, the thickness t1 of the field oxide film 11 may be preferably, for example, not more than about 2 μm. It was confirmed by the inventor that while suppression of electric field concentration at a portion 12*a* of the insulation layer 12 between the later-described polysilicon layers 13, 15, which are adjacent to each other, increases as the thickness t1 of the field oxide film 11 increases, the electric field strength of the field oxide film 11 decreases. Thus, the thickness t1 of the field oxide film 11 may be, for example, at least about 0.4 μm and preferably may be at least about 0.7 μm whereby during switching, the electric field strength of the portion 12*a* of the insulation layer 12 between the polysilicon layers 13, 15 that are adjacent to each other is not more than the electric field strength of the field oxide film 11.

A thickness t2 of a portion of the interlayer insulating film 49 on the polysilicon layers 13 to 16 is a thickness capable of electrically insulating the polysilicon layers 13, 14 and the metal layers (the gate pad 3 and the Rg measuring pad 4) and, for example, may be about 0.3 μm or more or preferably, may be about 0.5 μm or more. While concentration of electric field at the portion 12*a* of the insulation layer 1 between the polysilicon layers 13, 15 that are adjacent to each other is suppressed the thicker is the thickness t2 of the portion of the interlayer insulating film 49 on the polysilicon layers 13 to 16, cost increases and throughput decreases. Therefore, a thickness t3 of the interlayer insulating film 49 may be, for example, about 2 μm or less or preferably, as described hereinafter, may be about 1 μm or less with consideration of the source electrode 1 being extended on the interlayer insulating film 49 in the active region peripheral portion 31*b*.

In the active region peripheral portion 31*b*, the contact holes 49*a* to 49*e* that penetrate through the interlayer insulating film 49 in the depth direction Z are apart from one another in the interlayer insulating film 49. The contact holes 49*a*, 49*b* expose the polysilicon layer 16. The contact hole 49*c* extends in substantially a same layout as that of the gate metal wiring layer 5 and exposes the polysilicon layer 15. The contact holes 49*d*, 49*e* surround the periphery of the active region center portion 31*a* in concentric shapes and expose, respectively, the entire inner peripheral portion and the entire outer peripheral portion of the p$^{++}$-type outer peripheral contact region 64. The contact hole 49*e* penetrates through the insulation layer 12 in the depth direction Z.

In the active region peripheral portion 31*b*, each of the polysilicon layers 13 to 16 has substantially a same thickness and is provided at a same level in the insulation layer 12. The polysilicon layers 13 to 16 are provided on the front surface of the semiconductor substrate 20 via the field oxide film 11 and are covered overall (at respective upper surfaces and respective side surfaces) by the interlayer insulating film 49. The polysilicon layer (second polysilicon layer) 13 has a substantially rectangular shape with an outer diameter dimension that is larger than that of the gate pad 3 in a device plan view, and the polysilicon layer 13 faces the entire surface of the gate pad 3 in the depth direction Z via the interlayer insulating film 49. An entire outer periphery of the polysilicon layer 13 faces the gate metal wiring layer 5 in the depth direction Z via the interlayer insulating film 49. The polysilicon layer 13 has the same potential as that of the gate pad 3.

A polysilicon layer 14 has a substantially rectangular shape with an outer diameter dimension that is larger than that of the Rg measuring pad 4 in a device plan view and faces at least substantially an entire area of an outer periphery of the Rg measuring pad 4 in the depth direction via the interlayer insulating film 49. The polysilicon layer 14 is configured by the portions 15*a*, 16*a* of the polysilicon layers 15, 16 extending directly beneath the Rg measuring pad 4 (refer to FIG. 2). The polysilicon layer (first polysilicon layer) 15 is the gate polysilicon wiring layer configuring the gate runner 6. The polysilicon layer 15 is connected to the gate electrodes 48 (refer to FIG. 5) of all the unit cells of the MOSFET disposed in the active region center portion 31*a*.

The polysilicon layer 15 extends in substantially a same layout as that of the gate metal wiring layer 5 and faces the gate metal wiring layer 5 overall in the depth direction Z via the interlayer insulating film 49. The polysilicon layer 15 is electrically connected to the gate pad 3 via the later-described built-in gate resistor Rg and thus, has a potential that is lower than that of the gate pad 3 by the amount of the voltage drop at the built-in gate resistor Rg. As a result, the polysilicon layer 15 is disposed apart from the polysilicon layer 13. In particular, in a device plan view, the polysilicon layer 15 surrounds the periphery of the active region center portion 31*a* in a substantially rectangular shape in which a portion is opened, and surrounds the periphery of the polysilicon layer 13 in the substantially rectangular shape while being apart from the polysilicon layer 13 directly beneath the gate pad 3.

The polysilicon layer 15 is apart from the polysilicon layer 13 with the interlayer insulating film 49 (the insulation layer 12) intervening therebetween. In other words, the polysilicon layer 13 directly beneath the gate pad 3 and the polysilicon layer 15 of the gate runner 6 are apart from each other with the insulation layer 12 intervening therebetween, whereby the polysilicon layer 15 and the polysilicon layer 13 face each other across the insulation layer 12 in a direction parallel to the front surface of the semiconductor substrate 20. An interval (width of the portion 12*a* of the insulation layer 12 between the polysilicon layers 13, 15 adjacent to each other) w1 between the adjacent polysilicon layers 13, 15 is equivalent to a thickness (distance) capable of separating respective potentials of the polysilicon layers 13, 15 that are adjacent to each other and is, for example, about 2 μm or more.

Further, it was confirmed by the inventor that the wider is the interval w1 between the polysilicon layers 13, 15, which are adjacent to each other, the greater is the rise in potential at the portion 12*a* of the insulation layer 12 between the mutually adjacent polysilicon layers 13, 15. Thus, preferably, the interval w1 between the mutually adjacent polysilicon layers 13, 15, for example, may be about 10 μm or less.

Further, the polysilicon layer 15, at a portion surrounding the periphery of the active region center portion 31*a*, is wider at a side thereof facing the source electrode 1 than is that of the gate metal wiring layer 5 and faces an outer periphery of the source electrode 1 in the depth direction Z via the interlayer insulating film 49. The polysilicon layer 15 extends directly beneath the Rg measuring pad 4 along the outer periphery of the Rg measuring pad 4 so as to face substantially the entire outer periphery of the Rg measuring pad 4 in the depth direction Z, via the interlayer insulating film 49. The polysilicon layer 15, by the portion 15*a* thereof that extends directly beneath the Rg measuring pad 4, is connected with the polysilicon layer 16 (16*a*). A width of the polysilicon layer 15, for example, may be relatively wide in a vicinity of the Rg measuring pad 4.

Between the polysilicon layers 13, 15 adjacent to each other, the polysilicon layer (third polysilicon layer) 16 is disposed in a vicinity of the gate pad 3 and extends linearly between the polysilicon layers 13, 15 that are adjacent to each other. A first end of the polysilicon layer 16 in the longitudinal direction thereof is connected with the polysilicon layer 13 directly beneath the gate pad 3. A second end of the polysilicon layer 16 in the longitudinal direction thereof is connected with the polysilicon layer 15 directly beneath the Rg measuring pad 4. The periphery of the polysilicon layer 16, for example, excluding the connection between the polysilicon layer 16 and the polysilicon layers 13, 15 is surrounded by the polysilicon layer 15 via the insulation layer 12. The polysilicon layer 16 is connected to the gate pad 3 and the Rg measuring pad 4 via the contact holes 49*a*, 49*b* of the interlayer insulating film 49, respectively.

In the polysilicon layer 16, a portion between respective contacts thereof with the gate pad 3 and the Rg measuring pad 4 (portion between the contact holes 49*a*, 49*b*) constitutes the built-in gate resistor Rg. The built-in gate resistor Rg is connected in series with the gate electrodes 48 and has a function of suppressing oscillation (noise: abrupt current change di/dt per unit time) of the current waveform during switching. The higher the resistance value of the built-in gate resistor Rg is raised, the smaller the oscillation of the current waveform during switching may be made. The resistance value of the built-in gate resistor Rg is determined by a length (interval between the contact holes 49*a*, 49*b*) of the polysilicon layer 16 in the longitudinal direction and a length (width of the polysilicon layer 16 in the lateral direction) in a lateral direction. In multiple semiconductor substrates 20, the Rg measuring pad 4 disposed in each of the semiconductor substrates 20 is used to measure the resistance value of the built-in gate resistor Rg before product shipping.

In the active region peripheral portion 31*b*, the source electrode 1 extends on the insulation layer 12, from the active region center portion 31*a*. The source electrode 1 terminates closer to the chip center than is the gate metal wiring layer 5 that surrounds the periphery of the active region center portion 31*a*. The source electrode 1 is connected to the inner peripheral portion of the p$^{++}$-type outer peripheral contact region 64 via the contact hole 49*d* of the interlayer insulating film 49. An outer peripheral end of the source electrode 1 faces the polysilicon layer 15 in the depth direction Z via the interlayer insulating film 49. In the active region peripheral portion 31*b*, the source ring 2, the gate pad 3, the Rg measuring pad 4, and the gate metal wiring layer 5 are provided on the insulation layer 12.

The source ring 2 is connected to the outer peripheral portion of the p$^{++}$-type outer peripheral contact region 64 via the contact hole 49*e* of the insulation layer 12. The gate pad 3 and the Rg measuring pad 4 are connected to the polysilicon layer 16 via the contact holes 49*a*, 49*b* of the interlayer insulating film 49, respectively. The Rg measuring pad 4 is disposed in a vicinity of the gate pad 3, on the path of the gate metal wiring layer 5 and is directly connected to the gate metal wiring layer 5. The gate metal wiring layer 5 is connected to the polysilicon layer 15 via the contact hole 49*c* of the interlayer insulating film 49.

The gate metal wiring layer 5, at a portion surrounding the periphery of the gate pad 3, is wider at a side thereof facing the gate pad 3 than is that of the polysilicon layer 15 and faces the outer periphery of the polysilicon layer 13 in the depth direction Z via the interlayer insulating film 49. Thus, the insulation layer 12 is sandwiched between the polysilicon layer 13 directly beneath the gate pad 3 and the polysilicon layer 15 of the gate runner 6 adjacent to each other and all of the portion 12*a* separating the polysilicon layers 13, 15 is covered by the gate metal wiring layer (third electrode) 5. As a result, concentration of electric field at the portion 12*a* of the insulation layer 12 between the polysilicon layers 13, 15 adjacent to each other may be suppressed.

The gate metal wiring layer 5, at a portion surrounding the periphery of the active region center portion 31*a*, may face an entire area of the polysilicon layer 15. Provided the gate metal wiring layer 5 covers an end of the polysilicon layer 13 via the insulation layer 12 (the interlayer insulating film 49) in the depth direction Z to an extent of at least covering the portion 12*a* of the insulation layer 12 between the polysilicon layers 13, 15 that are adjacent to each other, the effect of mitigating electric field applied to the portion 12*a* of the insulation layer 12 is obtained. Preferably, in the depth direction Z, a width (distance) between the gate metal wiring layer 5 and the polysilicon layer 13 facing each other via the interlayer insulating film 49 may be, for example, about 20 μm or less or more preferably, may be about 10 μm or less, thereby, enabling reduction of the ratio of the active region peripheral portion 31*b* of the silicon carbide semiconductor device 10.

Next, operation of the silicon carbide semiconductor device 10 according to the first embodiment is described. When voltage (forward voltage, for example, about 1000V) that is positive with respect to the source electrode 1 is applied to the drain electrode 7 and voltage at least equal to a gate threshold voltage is applied to the gate electrodes 48, a channel (n-type inversion layer) is formed in portions of the p-type base region 43 along the trenches 46. As a result, directly beneath the source electrode 1, a main current (drift current) flows from the n$^{+}$-type drain region 41, through the n$^{-}$-type drift region 42, the n-type current spreading region 53, and the channel, to the n$^{+}$-type source regions 44, whereby the MOSFET (the silicon carbide semiconductor device 10) turns on.

On the other hand, when forward voltage is applied between a source and drain and voltage lower than the gate threshold voltage is applied to the gate electrodes 48, pn junctions (main junctions of the active region 31) 8*a* between the p-type base region 43, the p$^{+}$-type regions 51, 52, the n-type current spreading region 53, and the n$^{-}$-type drift region 42 are reverse biased and the MOSFET maintains an off state. Further, from the main junctions of the active region 31, a depletion layer spreads in the n$^{-}$-type drift region 42, from the active region 31 outward in a direction to the chip end. A predetermined breakdown voltage based on a width of the depletion layer and dielectric-breakdown electric field strength of silicon carbide, may be ensured to an extent that the depletion layer spreads through the edge termination region 32, in a direction to the chip end.

Further, directly beneath the gate pad 3, pn junctions (pn junctions directly beneath the gate pad 3) 8*b* between the p-type peripheral region 60 and the n$^{-}$-type drift region 42 (or the n-type current spreading region 53) are reverse biased, when forward voltage is applied between the source and drain. During this time, holes in the p-type peripheral region 60 move the shortest distance to the p$^{++}$-type outer peripheral contact region 64, which has the lowest resistance in the p-type peripheral region 60 (i.e., the holes move in a direction orthogonal to the front surface of the semiconductor substrate 20) and in the p$^{++}$-type outer peripheral contact region 64, move in a direction parallel to the front surface of the semiconductor substrate 20, being pulled out to the metal layer (the source electrode 1 and the source ring 2) having a potential closest to the source potential.

In other words, from a position facing substantially a center of the gate pad 3, displacement current (hole current) 101 flows, in a radial shape, a shortest distance through the p$^{++}$-type outer peripheral contact region 64, in a direction to the contact holes 49*d*, 49*e* that constitute contacts (connections) with the metal layer of a potential closest to the source potential (refer to an example in later-described FIG. 16). As a result, the p-type peripheral region 60 is depleted in vicinities of the pn junctions 8*b* of the n$^{-}$-type drift region 42. Further, the pn junctions 8*b* between the p-type peripheral region 60 and the n$^{-}$-type drift region 42 are reverse biased, whereby electrons in the n$^{-}$-type drift region 42 are pulled out to the drain electrode 7 and the n$^{-}$-type drift region 42 depletes in vicinities of the pn junctions 8*b* formed therewith the p-type peripheral region 60.

A depletion layer (electrostatic capacitance) formed by the pn junctions 8*b* between the p-type peripheral region 60 and the n$^{-}$-type drift region 42 fixes the pn junctions 8*b* to the potential of the source electrode 1 and bears high voltage applied to the drain electrode 7. As a result, rises in the potential of the p$^{++}$-type outer peripheral contact region 64 are suppressed. Further, assuming that, during switching transients, the voltage applied to the drain electrode 7 rises rapidly and due to abrupt rises (for example, about 300V) of the potential of the p$^{++}$-type outer peripheral contact region 64, the displacement current 101 oscillates and even when the current becomes unbalanced due to variation of the switching time between the semiconductor chips (the semiconductor substrates 20) connected in parallel, the insulation layer 12 does not dielectrically breakdown. A reason for this is as follows.

In an instance in which positive voltage applied to the drain electrode 7 during switching transients increases rapidly and the potential of the semiconductor substrate 20 directly beneath the gate pad 3 increases, high electric field in the semiconductor substrate 20 passes upward and out through the portion 12a of the insulation layer 12 between the polysilicon layers 13, 15 that are adjacent to each other. Therefore, in the portion 12a of the insulation layer 12, while electric field concentrates at side-surface lower ends (borders between side surface and lower surface) of the polysilicon layers 13, 15, the portion 12a of the insulation layer 12 is covered by the gate metal wiring layer 5 and fixed to the potential (for example, about 15V or less) of the gate metal wiring layer 5, whereby high electric field in the semiconductor substrate 20 does not easily reach the surface of the insulation layer 12. As a result, in the portion 12a of the insulation layer 12 between the polysilicon layers 13, 15 that are adjacent to each other, concentration of electric field at the side-surface lower ends of the polysilicon layers 13, 15 is suppressed.

Further, the polysilicon layer 13 is positioned directly beneath the portions of the surface of the insulation layer 12 exposed between the source electrode 1 and the gate metal wiring layer 5, and between the source ring 2 and the gate metal wiring layer 5 and thus, there is substantially no increase in potential. Portions of the interlayer insulating film 49 sandwiched between the gate pad 3 and the polysilicon layer 13, and between the gate metal wiring layer 5 and the polysilicon layer 15, are sandwiched between conductive layers of the same potential and thus, there is substantially no increase in potential. Concentration of electric field at the polysilicon layer 15 is suppressed by the metal layer having the source potential and thus, there is substantially no increase in the potential of the insulation layer 12 between a source contact (metal layer in the contact holes 49d, 49e) and the polysilicon layer 15. Therefore, dielectric breakdown at the insulation layer 12 does not occur.

As described above, according to the first embodiment, in the silicon carbide semiconductor device in which the polysilicon layer is disposed in the insulation layer, directly beneath the gate pad, the surface of the insulation layer sandwiched between and separating the polysilicon layer directly beneath the gate pad and the polysilicon layer of the gate runner adjacent to each other, is covered by the gate metal wiring layer. Thus, an entire area of the front surface of the semiconductor substrate in the active region peripheral portion is covered by any one of the metal layers (the gate metal wiring layer and the gate pad, or the polysilicon layer directly beneath these metal layers, or both; and an entire area of the upper most portion of the front surface of the semiconductor substrate in the active region peripheral portion is fixed to a potential not more than the potential of the gate pad.

As a result, even when the potential of the semiconductor substrate directly beneath the gate pad rises due to displacement current occurring during switching and high electric field in the semiconductor substrate passes upward and out through the insulation layer between the polysilicon layers that are adjacent to each other, high electric field in the semiconductor substrate does not easily reach the surface of the insulation layer. Thus, between the polysilicon layers that are adjacent to each other, concentration of electric field at the side-surface lower ends of the polysilicon layers is suppressed and dielectric breakdown of the insulation layer between the polysilicon layers that are adjacent to each other may be prevented. Therefore, even in a module in which multiple semiconductor chips (the semiconductor substrates) are mounted connected in parallel, in each of the semiconductor chips, dielectric breakdown does not easily occur and operation reliability is enhanced.

In other words, according to the first embodiment, with about a same switching speed as that of the structure (refer to FIGS. 18 to 20) given as the comparison example being maintained, the operation reliability may be enhanced to a greater extent than that of the comparison example. Alternatively, with about a same operation reliability as that of the structure of the comparison example being maintained, a speed faster than that of the structure of the comparison example is possible and switching loss may be reduced to a greater extent than that of the structure of the comparison example.

Figure 6:
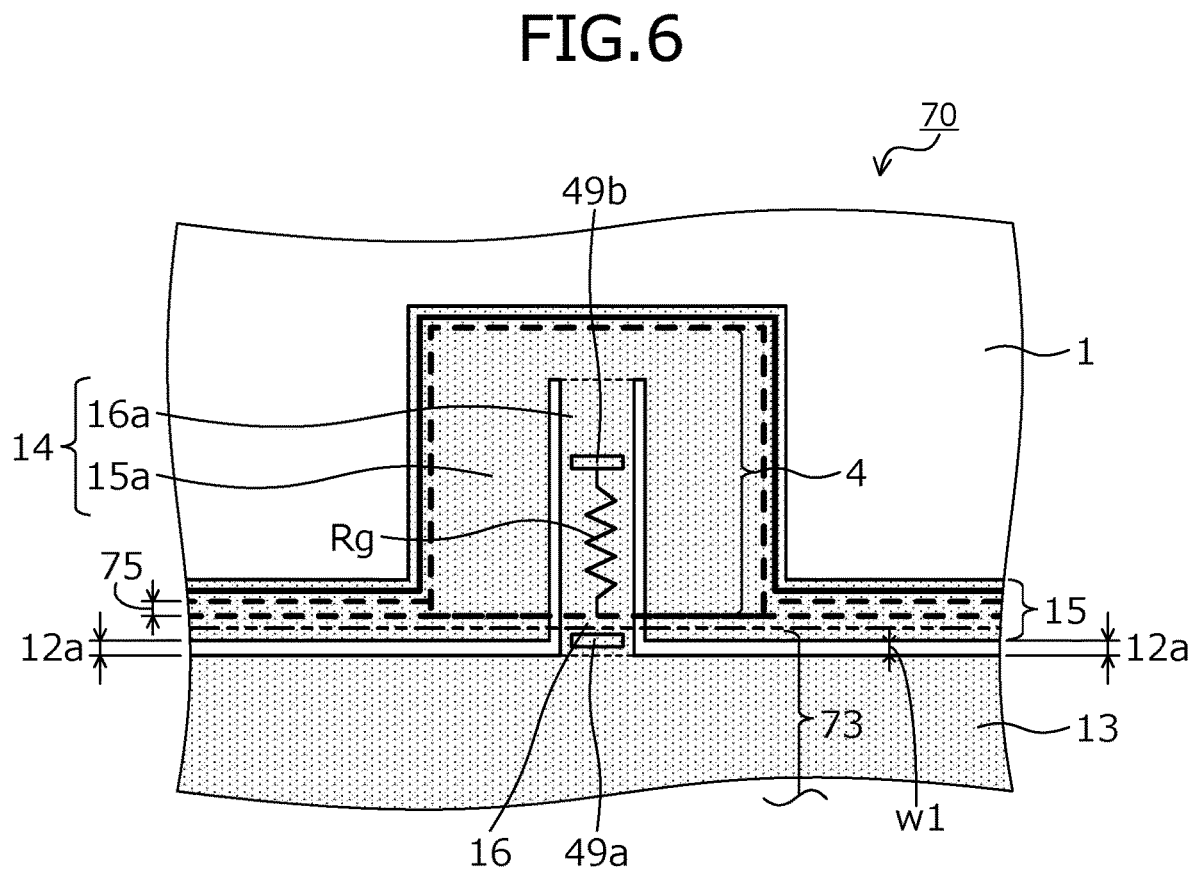
Figure 7:
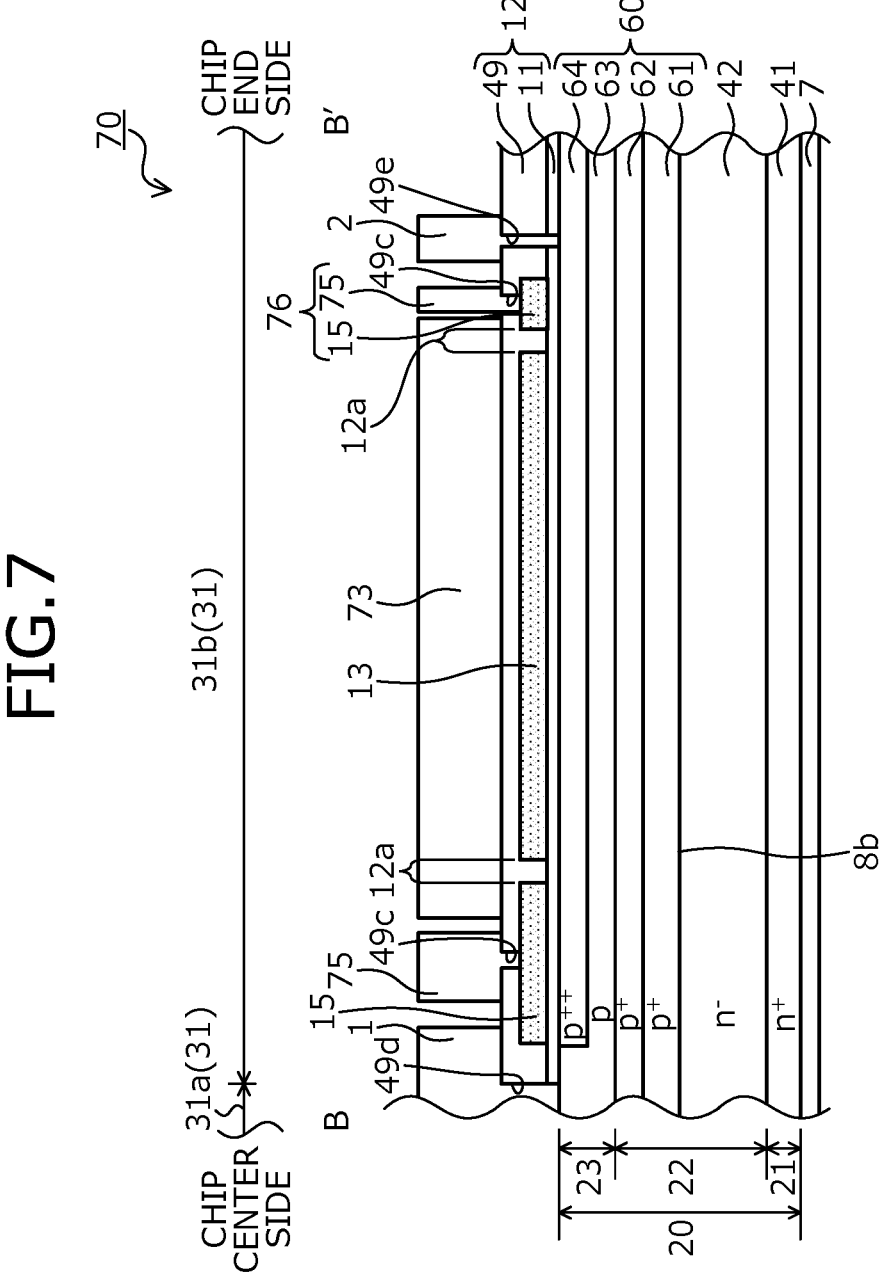
FIG. 7 is a cross-sectional view depicting a structure of the silicon carbide semiconductor device according to the second embodiment.

A structure of a silicon carbide semiconductor device according to a second embodiment is described. FIG. 6 is an enlarged plan view of a portion of a layout when the silicon carbide semiconductor device according to the second embodiment is viewed from the front side of the semiconductor substrate thereof. FIG. 7 is a cross-sectional view depicting the structure of the silicon carbide semiconductor device according to the second embodiment. The layout when a silicon carbide semiconductor device 70 according to the second embodiment is viewed from the front side of the semiconductor substrate thereof is the same as that depicted in FIG. 1, replacing reference numerals 10, 3, and 5 in FIG. 1 with reference numerals 70, 73, and 75. FIG. 6 depicts an enlarged plan view of a vicinity of the built-in gate resistor Rg depicted in FIG. 1. FIG. 7 is a cross-sectional view along cutting line B-B' depicted in FIG. 1.

In FIG. 6, the polysilicon layers 13 to 16 are indicated by the same hatching and connections between the polysilicon layer 16 and the polysilicon layers 13, 15 are indicated by dashed lines. In FIG. 6, a portion (portion facing the Rg measuring pad 4 and a gate metal wiring layer 75) of the outer periphery of the source electrode 1 is indicated by a bold solid line while outer peripheries of the Rg measuring pad 4 and the gate metal wiring layer 75 are indicated by bold dashed lines and a gate pad 73 is indicated by a two-dot chain link. Configuration of the source electrode 1, the Rg measuring pad 4, and the polysilicon layers 13 to 16 is the same as that in the first embodiment. Configuration of the active region center portion 31a is the same as that in the first embodiment (refer to FIG. 5).

The silicon carbide semiconductor device 70 according to the second embodiment differs from the silicon carbide semiconductor device 10 according to the first embodiment (refer to FIGS. 2, 4) in that the portion 12a of the insulation layer 12 between the polysilicon layers 13, 15 that are adjacent to each other is covered by the gate pad (third electrode) 73 instead of the gate metal wiring layer 75 of a gate runner 76.

In particular, in the second embodiment, the gate pad 73 has a substantially rectangular shape with an outer diameter dimension that is larger than that of the polysilicon layer 13 in a device plan view, and faces the entire surface of the polysilicon layer 13 in the depth direction Z via the interlayer insulating film 49. An entire outer periphery of the gate pad 73 faces, in the depth direction Z via the interlayer insulating film 49, the polysilicon layer 15 directly beneath the gate metal wiring layer 75 that surrounds a periphery of the gate pad 73. In the depth direction Z, a width (distance) between the gate pad 73 and the polysilicon layer 15 facing each other via the interlayer insulating film 49 is a same width (distance) as that between the gate metal wiring layer 5 and the polysilicon layer 13 that face each other in the depth direction Z via the interlayer insulating film 49 in the first embodiment.

The gate metal wiring layer 75, in a portion surrounding the periphery of the gate pad 73, faces the polysilicon layer 15 in the depth direction Z via the interlayer insulating film 49. In other words, in the portion surrounding the periphery of the gate pad 73, the gate metal wiring layer 75 has a width in a direction away from the gate pad 73 narrower than that of the polysilicon layer 15 therebelow. In the gate pad 73, as described above, other than the external dimension being increased, configuration thereof is the same as that of the gate pad 3 of the first embodiment. In the gate metal wiring layer 75, as described above, other than the width of the portion surrounding the periphery of the gate pad 73 being narrower, configuration thereof is the same as that of the gate metal wiring layer 5 of the first embodiment.

As described above, according to the second embodiment, the insulation layer between the polysilicon layer directly beneath the gate pad and the polysilicon layer of the gate runner adjacent to each other is covered by the gate pad, whereby effects similar to those of the first embodiment may be obtained.

Figure 8:
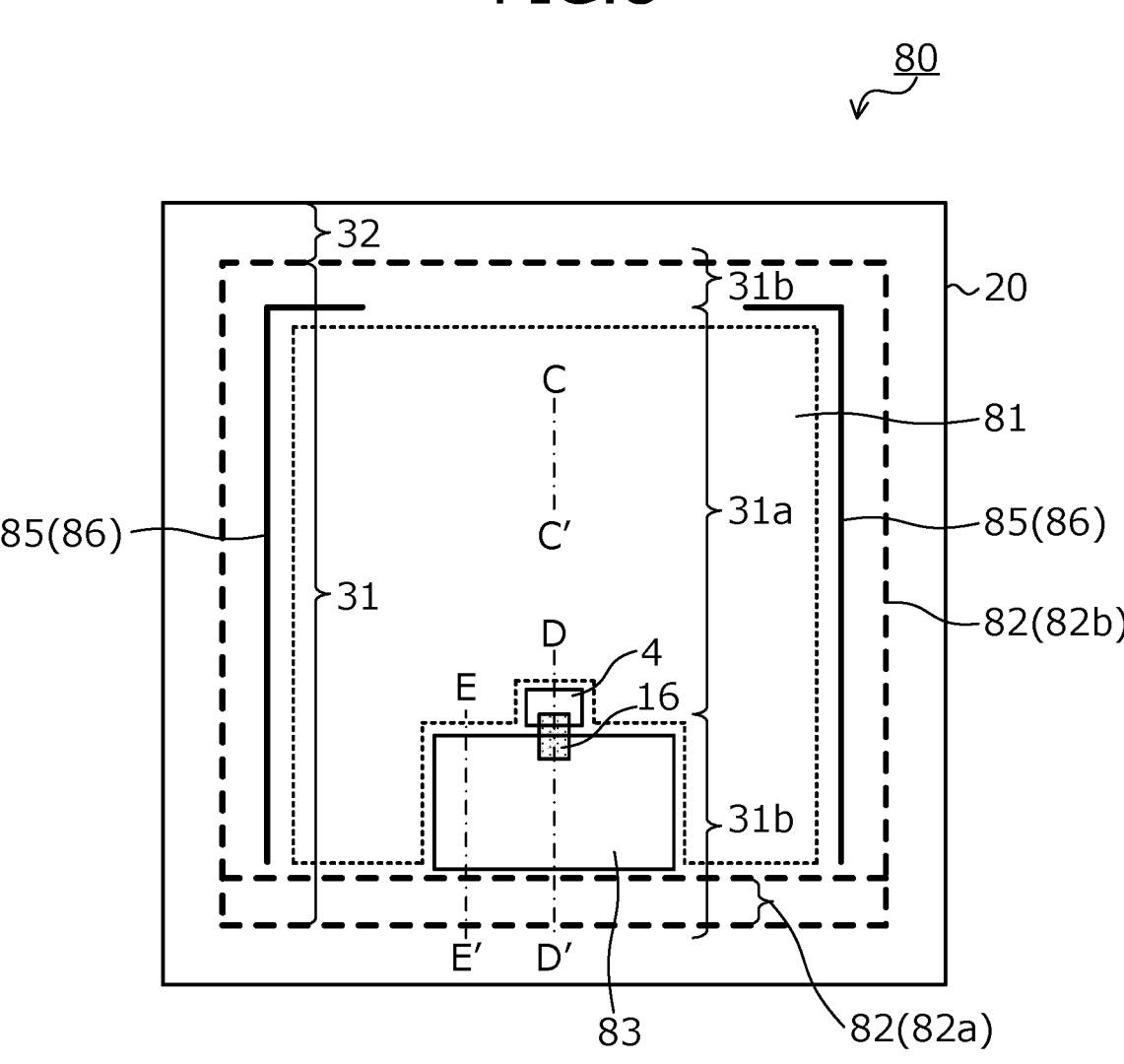
FIG. 8 is a plan view depicting a layout when the silicon carbide semiconductor device according to the third embodiment is viewed from the front side of the semiconductor substrate thereof.

A structure of a silicon carbide semiconductor device according to a third embodiment is described. FIG. 8 is a plan view depicting a layout when the silicon carbide semiconductor device according to the third embodiment is viewed from the front side of the semiconductor substrate thereof. In FIG. 8, metal layers (a source electrode 81, a source ring 82, a gate pad 83, the Rg measuring pad 4, and a gate metal wiring layer 85) on the front surface of the semiconductor substrate 20 and the polysilicon layer (hatched portion) 16 constituting the built-in gate resistor Rg are depicted while the polysilicon layers 13 to 15 are not depicted. In FIG. 8, the source electrode 81 is indicated by a dashed line, a first portion 82a of the source ring 82 is surrounded by a bold dashed line, a second portion 82b of the source ring 82 is indicated by a bold dashed line, and the gate metal wiring layer 85 is indicated by a bold solid line.

Figure 9:
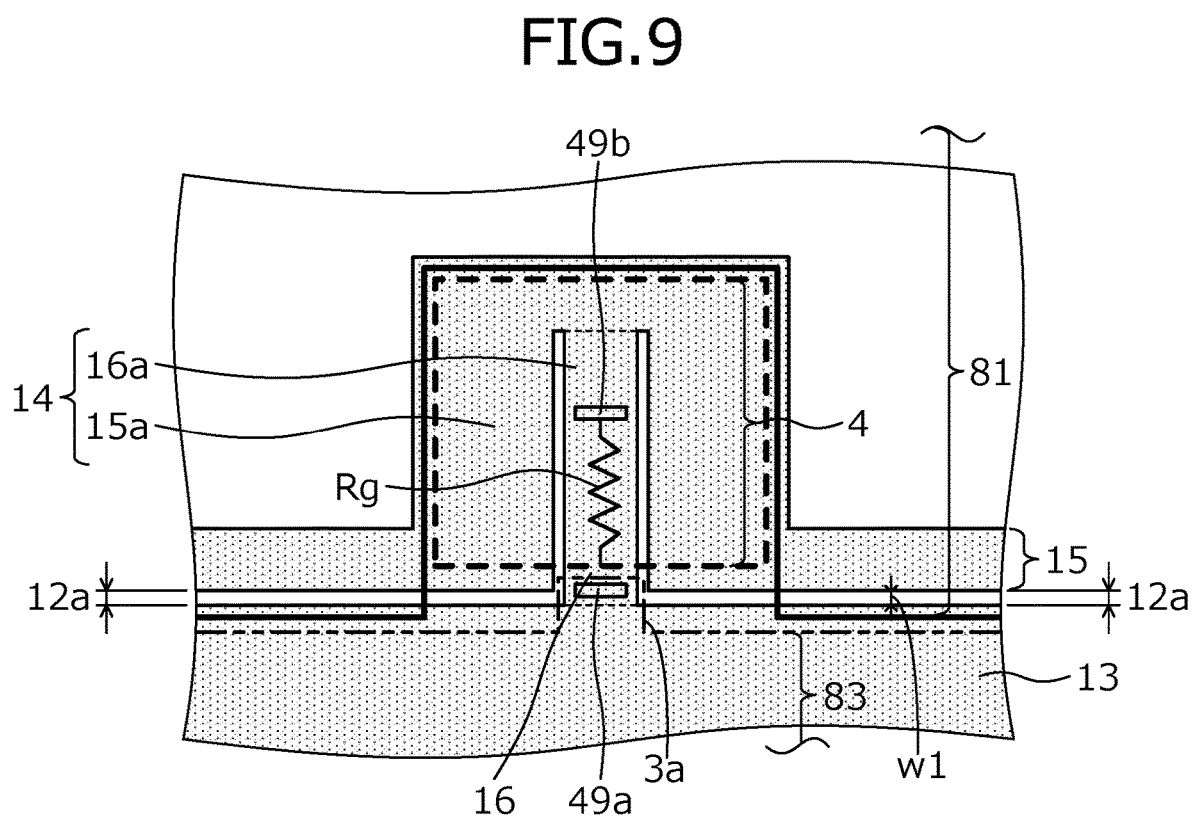
Figure 10:
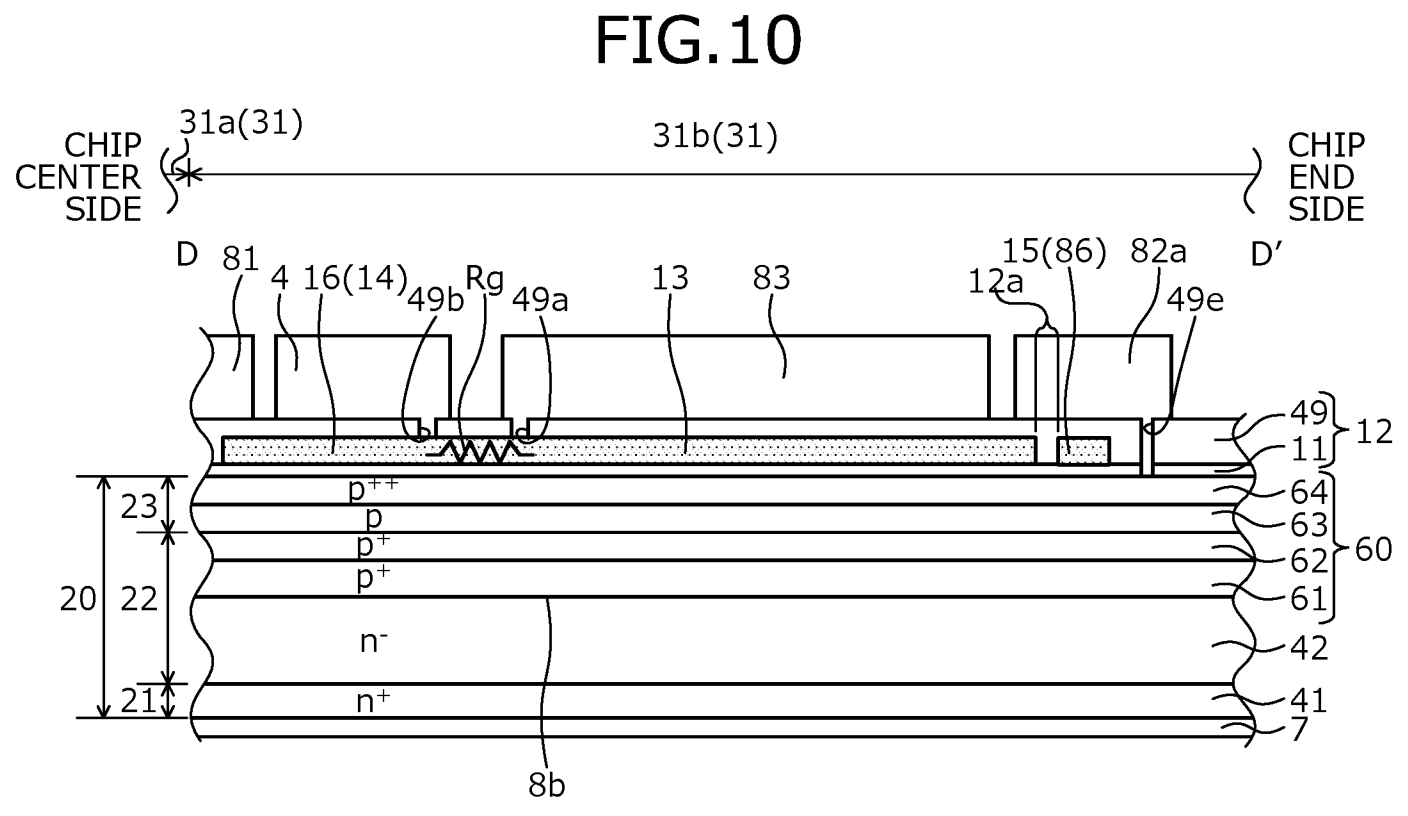
Figure 11:
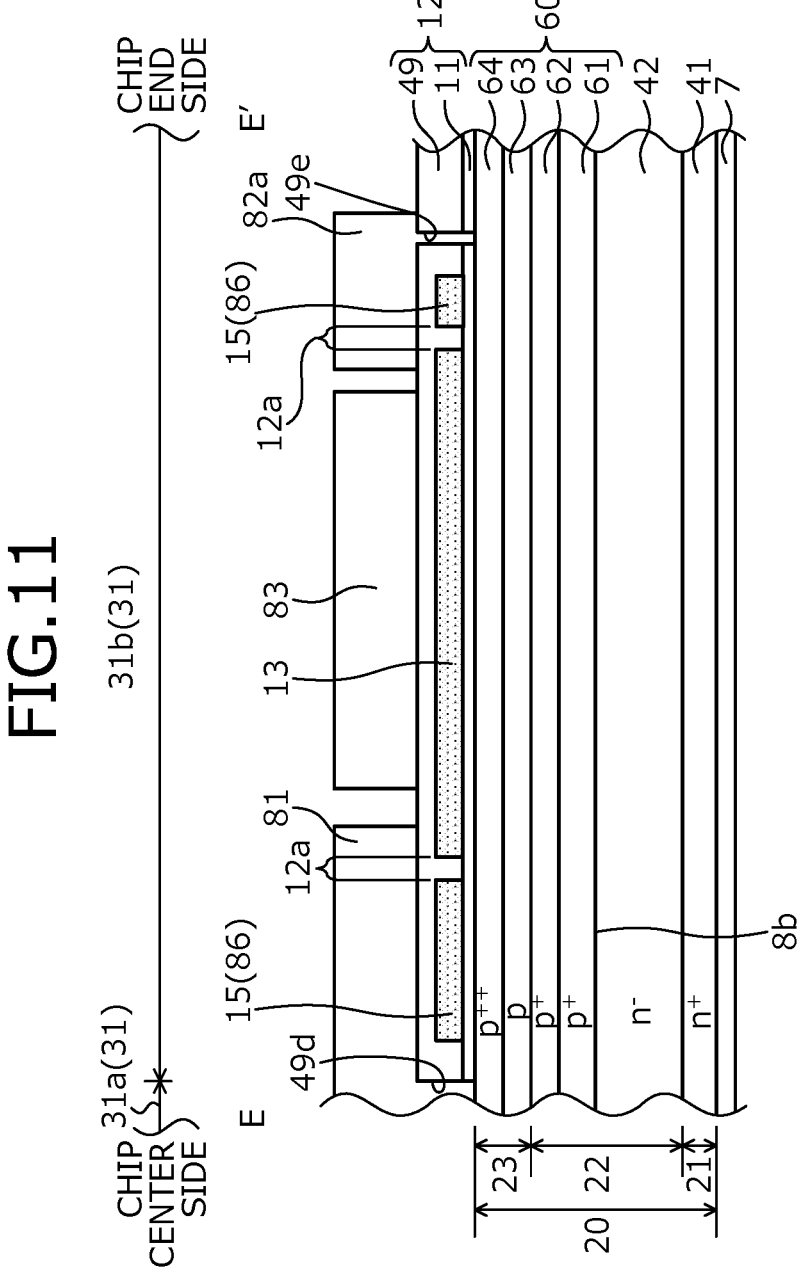
FIG. 11 is a cross-sectional view along cutting line E-E' in FIG. 8.

FIG. 9 is an enlarged plan view of a vicinity of the built-in gate resistor Rg depicted in FIG. 8. In FIG. 9, the polysilicon layers 13 to 16 are indicated by the same hatching and connections between the polysilicon layer 16 and the poly-silicon layers 13, 15 are indicated by dashed lines. In FIG. 9, a portion (portion facing the Rg measuring pad 4 and the gate pad 83) of an outer periphery of the source electrode 81 is indicated by a bold solid line, the outer periphery of the Rg measuring pad 4 is indicated by a bold dashed line, and the gate pad 83 is indicated by a two-dot chain line. Configuration of the Rg measuring pad 4 and the polysilicon layers 13 to 16 is the same as that of the first embodiment. FIGS. 10 and 11 are cross-sectional views along cutting line D-D' and cutting line E-E' in FIG. 8, respectively. Configuration along cutting line C-C' in FIG. 8 is the same as that of the first embodiment (refer to FIG. 5).

A silicon carbide semiconductor device 80 according to the third embodiment differs from the silicon carbide semiconductor device 10 according to the first embodiment (refer to FIGS. 1 to 4) in that the portion 12a of the insulation layer 12 between the polysilicon layers 13, 15 that are adjacent to each other is covered by metal layers (third electrode: the source electrode 81 and the source ring 82) of the source potential instead of the gate metal wiring layer 85 of a gate runner 86. A width (distance) between the metal layers of the source potential and the polysilicon layer 13 that face each other in the depth direction Z via the interlayer insulating film 49 is the same as the width (distance) between the gate metal wiring layer 5 and the polysilicon layer 13 that face each other in the depth direction Z via the interlayer insulating film 49 in the first embodiment.

In particular, similar to the first embodiment, in the third embodiment, the source electrode 81, for example, has a substantially rectangular shape with a portion recessed toward the chip center in a device plan view, and covers the entire area of the active region center portion 31a. In the recessed portion of the source electrode 81, similar to the recessed portion in the first embodiment, the gate pad 83 is disposed apart from the other metal layers. Side surfaces of the recessed portion of the source electrode 81 are at positions facing the polysilicon layer 13 in the depth direction Z via the interlayer insulating film 49. Thus, the source electrode 81, in the depth direction Z via the interlayer insulating film 49, faces three sides of the outer periphery of the polysilicon layer 13 and three sides of the polysilicon layer 15 surrounding the periphery of the polysilicon layer 13 in a rectangular shape in a device plan view, and covers the portion 12a of the insulation layer 12 between the polysilicon layers 13, 15 that are adjacent to each other.

The source ring 82, similarly to that of the first embodiment, extends in a substantially rectangular shape along the outer periphery of the active region peripheral portion 31b in a device plan view, and is apart from and surrounds the source electrode 81. The source ring 82, at the first portion 82a thereof facing the gate pad 83, faces the remaining outer peripheral side of the polysilicon layer 13 in the depth direction Z via the interlayer insulating film 49 and has a width that widens in a direction to the chip center in a device plan view. Thus, the first portion 82a of the source ring 82, in the depth direction Z via the interlayer insulating film 49, faces the remaining outer peripheral side of the polysilicon layer 13 and a remaining side of the polysilicon layer 15 surrounding the periphery of the polysilicon layer 13 in a rectangular shape, and covers the portion 12a of the insulation layer 12 between the polysilicon layers 13, 15.

The first portion 82a of the source ring 82 may be an entire area of one side of the source ring 82, including a portion thereof facing the gate pad 83. The gate metal wiring layer 85 extends along the inner periphery of the active region peripheral portion 31b, between the source electrode 81 and the second portion 82b but not between the source electrode 81 and the first portion 82a of the source ring 82; and in a substantially L-shape or a substantially U-shape in a device plan view, the gate metal wiring layer 85 surrounds a portion of the periphery of the source electrode 81 not facing the gate pad 83. The gate metal wiring layer 85 is not provided between the source electrode 81 and the gate pad 83, nor between the first portion 82a of the source ring 82 and the gate pad 83. The gate metal wiring layer 85 is not directly connected to the Rg measuring pad 4. The gate metal wiring layer 85 is electrically connected to the gate pad 83 via the polysilicon layers 15, 16.

The polysilicon layer 13, similarly to that of the first embodiment, has a substantially rectangular shape with an outer diameter dimension larger than that of the gate pad 83 in a device plan view, and faces the entire surface of the gate pad 83 in the depth direction Z via the interlayer insulating film 49. Three sides of the outer periphery of the polysilicon layer 13 face the source electrode 81 in the depth direction Z via the interlayer insulating film 49 while the remaining side of the outer periphery of the polysilicon layer 13 faces the source ring 82 in the depth direction Z via the interlayer insulating film 49, in a device plan view. The polysilicon layer 15, at a portion surrounding the periphery of the polysilicon layer 13, faces the metal layers (the source electrode 81 and the first portion 82a of the source ring 82) of the source potential in the depth direction Z via the interlayer insulating film 49, and at a remaining portion, is in contact with the gate metal wiring layer 85 via the contact hole 49c.

The portion 12a of the insulation layer 12 between the polysilicon layers 13, 15 that are adjacent to each other is covered by the metal layers of the source potential and fixed to the source potential (ground potential), whereby similar to the first embodiment, even when the potential of the p$^{++}$-type outer peripheral contact region 64 is raised, high electric field in the semiconductor substrate 20 does not easily reach the surface of the insulation layer 12. In the third embodiment, in depth direction Z via the interlayer insulating film 49, while the metal layers of the source potential face the polysilicon layer 15 of the gate runner 86 and the polysilicon layer 13 directly beneath the gate pad 83, the potential difference of the metal layers of the source potential and the polysilicon layers 13, 15 is small and, for example, is not more than about 20V. Therefore, there is substantially no rise in the potential of the interlayer insulating film 49 between the metal layers of the source potential and the polysilicon layers 13, 15.

As described, configuration of the source electrode 81 is the same as that of the source electrode 1 of the first embodiment with the exception of the source electrode 81 extending in a direction to the gate pad 83 and reaching a position facing the polysilicon layer 13 in the depth direction Z. As described, the configuration of the source ring 82 is the same as that of the source ring 2 of the first embodiment with the exception of the first portion 82a thereof extending in direction to the chip center and reaching a position facing the polysilicon layer 13 in the depth direction Z. As described, the configuration of the gate pad 83 is the same as that of the gate pad 3 of the first embodiment with the exception of the periphery of the gate pad 83 being surrounded by the metal layers of the source potential. As described, the configuration of the gate metal wiring layer 85 is the same as that of the gate metal wiring layer 5 of the first embodiment with the exception of the layout as viewed from the front side of the semiconductor substrate 20 being different.

As described, according to the third embodiment, even in an instance in which the insulation layer intervening between the polysilicon layer directly beneath the gate pad and the polysilicon layer of the gate runner adjacent to each other is covered by the metal layers of the source potential, effects similar to those of the first and second embodiments may be obtained.

Figure 12:
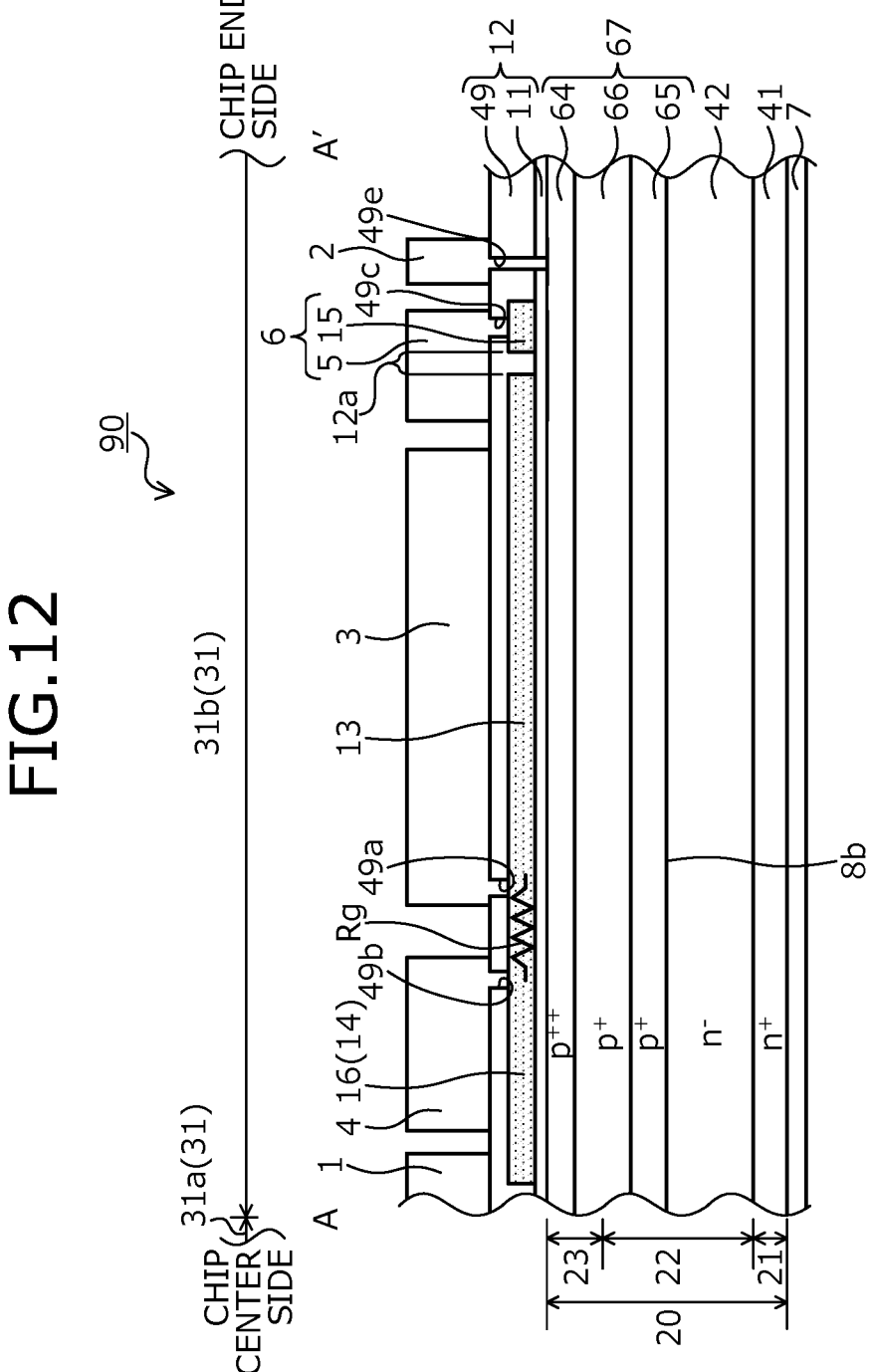
FIG. 12 is a cross-sectional view depicting a structure of a silicon carbide semiconductor device according to a fourth embodiment.
Figure 13:
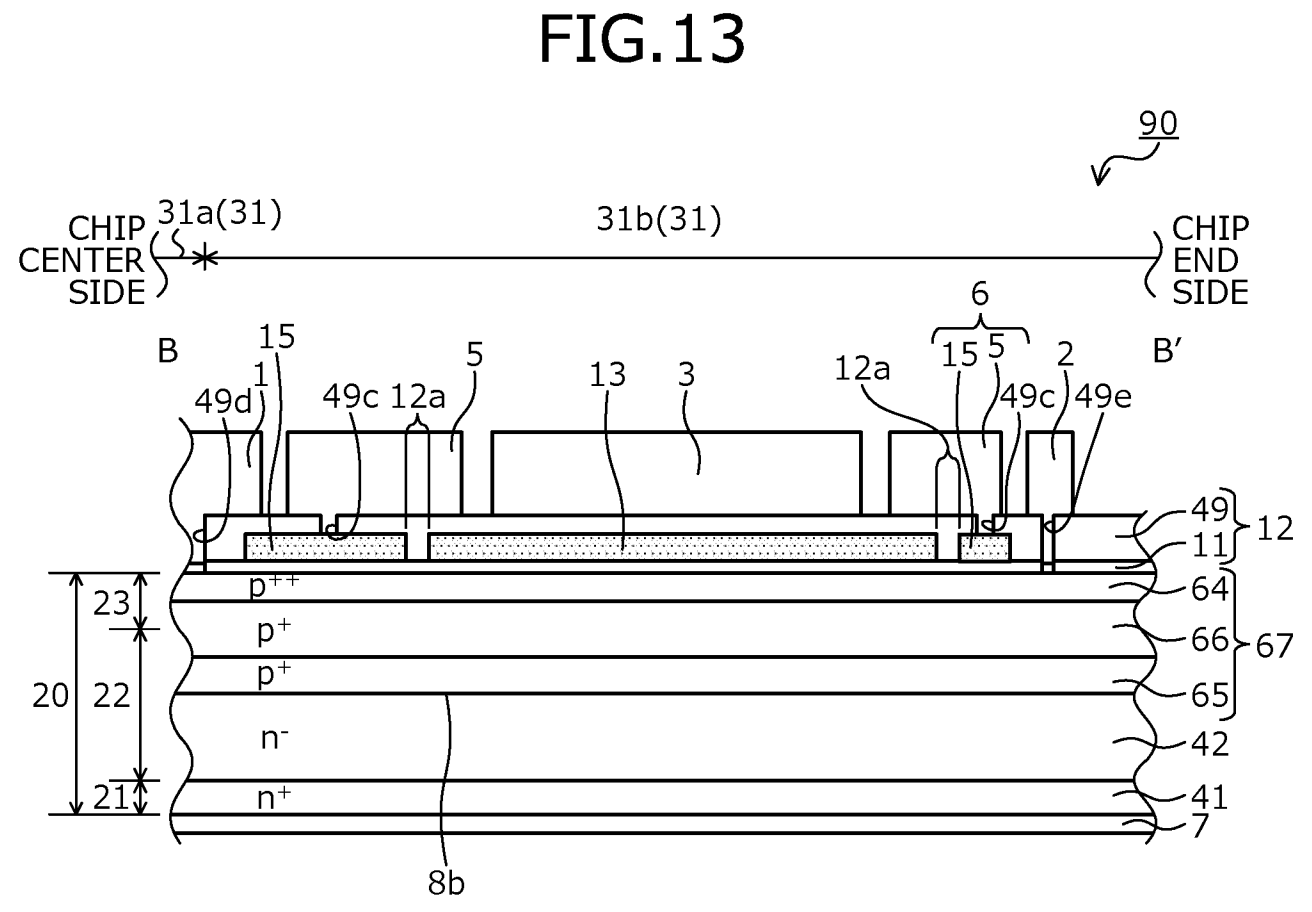
Figure 14:
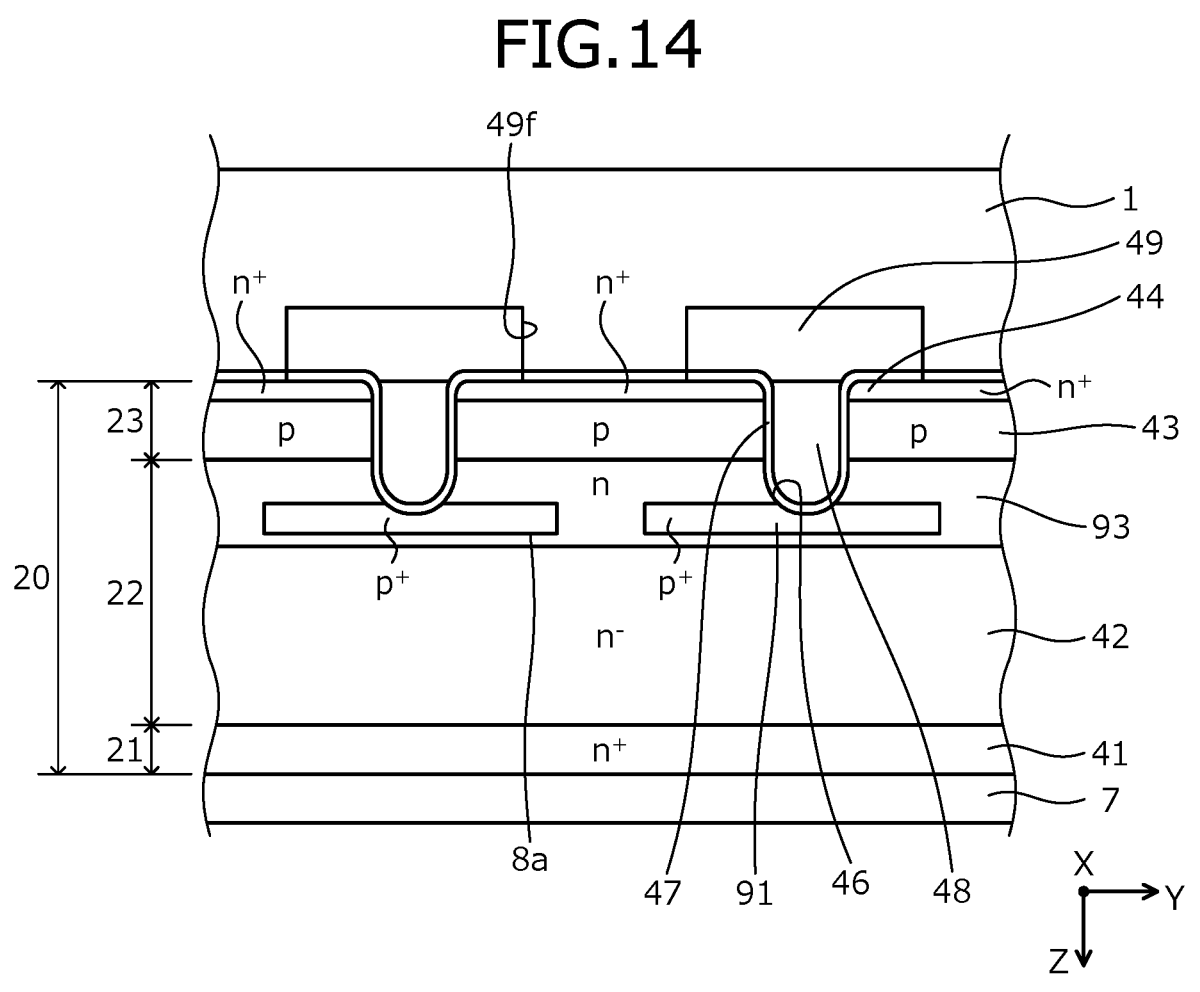
Figure 15:
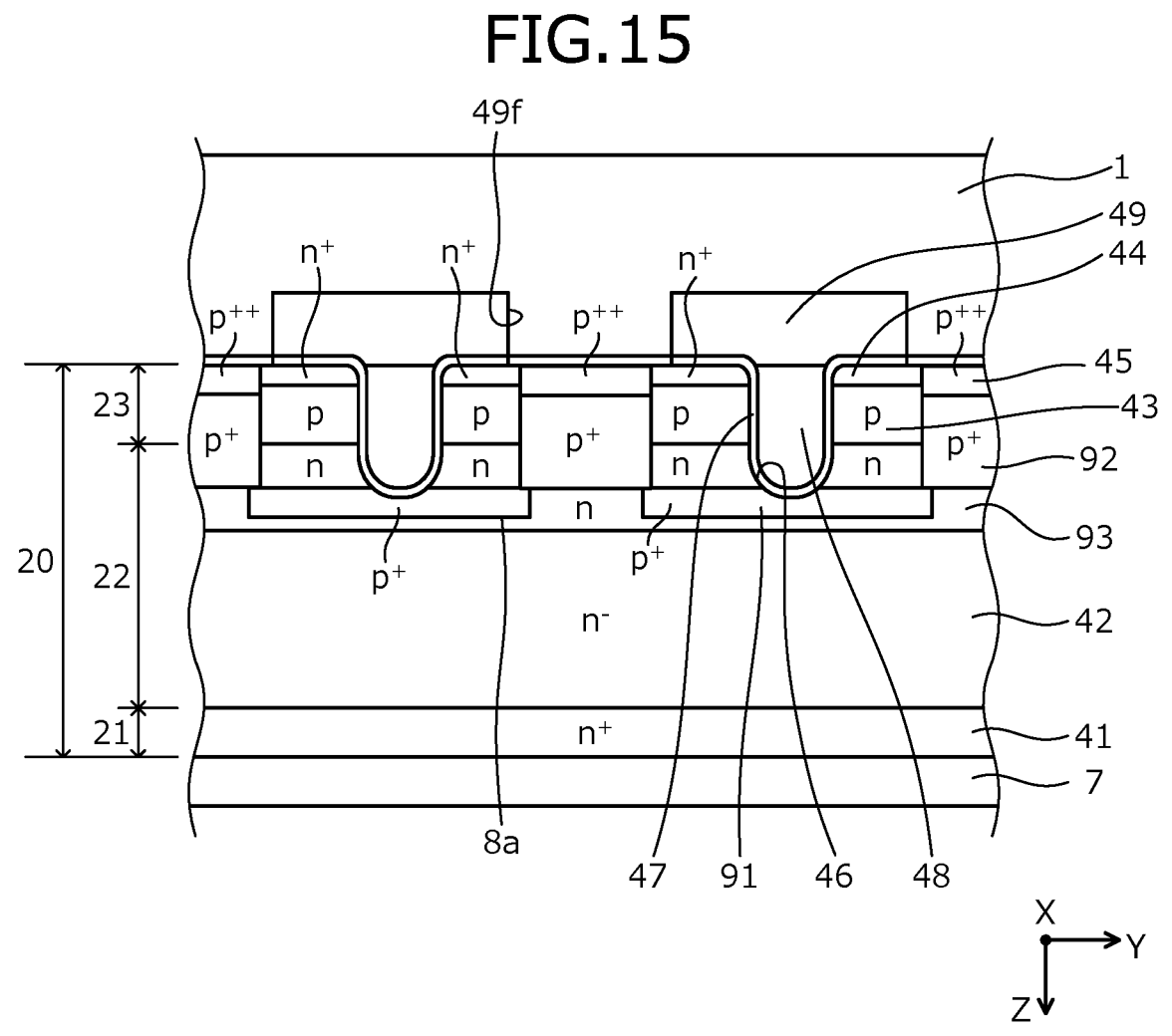

A structure of a silicon carbide semiconductor device according to a fourth embodiment is described. FIGS. 12, 13, 14, and 15 are cross-sectional views depicting the structure of the silicon carbide semiconductor device according to the fourth embodiment. A layout when a silicon carbide semiconductor device 90 according to the fourth embodiment is viewed from the front side of the semiconductor substrate thereof is the same as that in FIG. 1 with reference numeral 10 being replaced with reference numeral 90. FIGS. 12 and 13 are cross-sectional views along cutting line A-A' and cutting line B-B', respectively, depicted in FIG. 1. FIGS. 14 and 15 are cross-sectional views along cutting line C-C' depicted in FIG. 1. In the fourth embodiment, the structure depicted in FIG. 14 and the structure depicted in FIG. 15 repeatedly alternate with one each other in the longitudinal direction (the first direction X) of the trenches 46.

The silicon carbide semiconductor device 90 according to the fourth embodiment differs from the silicon carbide semiconductor device 10 according to the first embodiment (refer to FIGS. 3 and 4) in the following two ways. The first difference is that a p-type peripheral region 67 is configured by only p$^+$-type outer peripheral regions 65, 66 and the p$^{++}$-type outer peripheral contact region 64 and does not include a p-type base extension (FIGS. 12, 13). In the fourth embodiment, in the active region peripheral portion 31b, the p$^+$-type outer peripheral regions 65, 66 and the p$^{++}$-type outer peripheral contact region 64 are provided between the front surface of the semiconductor substrate 20 and the n$^-$-type drift region 42; the p$^+$-type outer peripheral regions 65, 66 and the p$^{++}$-type outer peripheral contact region 64 being adjacent to one another in the depth direction Z, sequentially in a direction from the n$^-$-type drift region 42.

The p$^+$-type outer peripheral regions 65, 66 are diffused regions formed in the epitaxial layers 22, 23 by ion implantation. The p$^+$-type outer peripheral regions 65, 66, for example, are respectively formed concurrently with later-described p$^+$-type regions 91, 92 of the active region center portion 31a, between the p$^{++}$-type outer peripheral contact region 64 and the n$^-$-type drift region 42, and are adjacent to each other in the depth direction Z. The p$^+$-type outer peripheral regions 65, 66 are provided in an entire area between the p$^{++}$-type outer peripheral contact region 64 and the n$^-$-type drift region 42. A lower surface of the p$^+$-type outer peripheral region 65 is in contact with the n$^-$-type drift region 42. An upper surface of the p$^+$-type outer peripheral region 66 is a in contact with the p$^{++}$-type outer peripheral contact region 64.

The configuration of the p$^{++}$-type outer peripheral contact region 64 is the same as that in the first embodiment. The p-type base region 43 is not provided between the p$^{++}$-type outer peripheral contact region 64 and the p$^+$-type outer peripheral region 65. In other words, the p-type base region 43 is provided only in the active region center portion 31a and does not extend on the active region peripheral portion 31b. As described above, the configuration of the p-type peripheral region 67 is the same as that of the p-type peripheral region 67 in the first embodiment with the exception that the p-type base extension not being provided. The p-type peripheral region 67 with such a configuration, for example, is useful in an instance in which the later-described p$^+$-type regions 91, 92 are disposed in vicinities of the bottoms of the trenches 46.

The second difference is that the configuration of the p$^+$-type regions 91, 92 (FIGS. 14, 15) for mitigating electric field in vicinities of the bottoms of the trenches 46 differs from that in the first embodiment. The configuration of the trench gate structure (the p-type base region 43, the n$^+$-type source regions 44, the p$^{++}$-type contact regions 45, the trenches 46, the gate insulating films 47, and the gate electrodes 48) is the same as that in the first embodiment. The p$^+$-type regions 91, 92 are fixed to the potential of the source electrode 1 and have a function of depleting (or causing an n-type current spreading region 93 to deplete, or both) when the MOSFET (the silicon carbide semiconductor device 90) is off and mitigating electric field applied to the gate insulating films 47.

The configurations of the p$^+$-type regions 91 and the n-type current spreading region 93 are the same as those of the p$^+$-type regions 51 and the n-type current spreading region 53 of the first embodiment. The p$^+$-type regions 92 are selectively provided between the n$^-$-type drift region 42 and the p$^{++}$-type contact regions 45, at positions closer to the n$^+$-type source regions 44 than are the p$^+$-type regions 91. The p$^+$-type regions 92, for example, are formed divided into to two stages by a multistage epitaxial method, in the epitaxial layers 22, 23. The p$^+$-type regions 92 are regions connecting the p$^+$-type regions 91 and the p$^{++}$-type contact regions 45 to each other and are provided in substantially a center between any adjacent two of the trenches 46, apart from the trenches 46.

The $p^+$-type regions 92 are disposed directly beneath the $p^{++}$-type contact regions 45, scattered in the longitudinal direction (the first direction X) of the trenches 46, at a same pitch as that of the $p^{++}$-type contact regions 45. The $p^+$-type regions 92 have upper surfaces in contact with the $p^{++}$-type contact regions 45 and are electrically connected to the source electrode 1 via the $p^{++}$-type contact regions 45. The $p^+$-type regions 92 regions are for connecting the $p^+$-type regions 91 and the $p^{++}$-type contact regions 45 to each other and thus, an impurity concentration of the $p^+$-type regions 92 regions may be lower than that of the $p^+$-type regions 91. Widths (widths in the first and second directions X, Y) of each of the $p^+$-type regions 92 are the same as those of each of the $p^{++}$-type contact regions 45.

A lower surface of each of the $p^+$-type regions 92 is positioned at substantially a same depth as that of the upper surface of each of the $p^+$-type regions 91. Each of the $p^+$-type regions 92 is between a corresponding adjacent two of the $p^+$-type regions 91 in the second direction Y and a lower surface of each of the $p^+$-type regions 92 is in contact with a portion of the upper surface of each of the adjacent two of the $p^+$-type regions 91. The lower surface of each of the $p^+$-type regions 92 is in contact with the n-type current spreading region 93 except for the portions thereof in contact with the $p^+$-type regions 91. The $p^+$-type regions 92 are positioned at a depth closer to the $n^+$-type source regions 44 than are the $p^+$-type regions 91, whereby a junction FET (JFET) region may be shared between any adjacent two of the unit cells. A JFET region is a region through which a main current flows, between any adjacent two of the trenches 46.

A portion of the $n^-$-type epitaxial layer 22 excluding the $p^+$-type regions 91, 92, the n-type current spreading region 93, and the $p^+$-type outer peripheral regions 65, 66 constitutes the $n^-$-type drift region 42. A portion of the p-type epitaxial layer 23 excluding the $n^+$-type source regions 44, the $p^{++}$-type contact regions 45, the $p^+$-type regions 92, the $p^{++}$-type outer peripheral contact region 64, and the $p^+$-type outer peripheral region 65 constitutes the p-type base region 43. The n-type current spreading region 93 may be omitted. In this instance, instead of the n-type current spreading region 93, the $n^-$-type drift region 42 is between the $p^+$-type regions 91, 92, which are adjacent to each other, and reaches the p-type base region 43.

The configuration of the metal layers (the source electrode 1, the source ring 2, the gate pad 3, the Rg measuring pad 4, and the gate metal wiring layer 5) on the front surface of the semiconductor substrate 20 is the same as that in the first embodiment. In other words, an entire area of the portion 12a of the insulation layer 12 between the polysilicon layers 13, 15 that are adjacent to each other is covered by the gate metal wiring layer 5. The second and third embodiments may be applied to the silicon carbide semiconductor device 90 according to the fourth embodiment, the portion 12a of the insulation layer 12 between the polysilicon layers 13, 15 that are adjacent to each other may be covered by the gate pad 73 (refer to FIGS. 6, 7) or the metal layers of the source potential (refer to FIGS. 8 to 11).

As described above, according to the fourth embodiment, even in an instance in which the layered structure of the p-type peripheral region is changed according to the structure of the active region center portion, effects similar to those of the first to third embodiments may be obtained.

Figure 16:
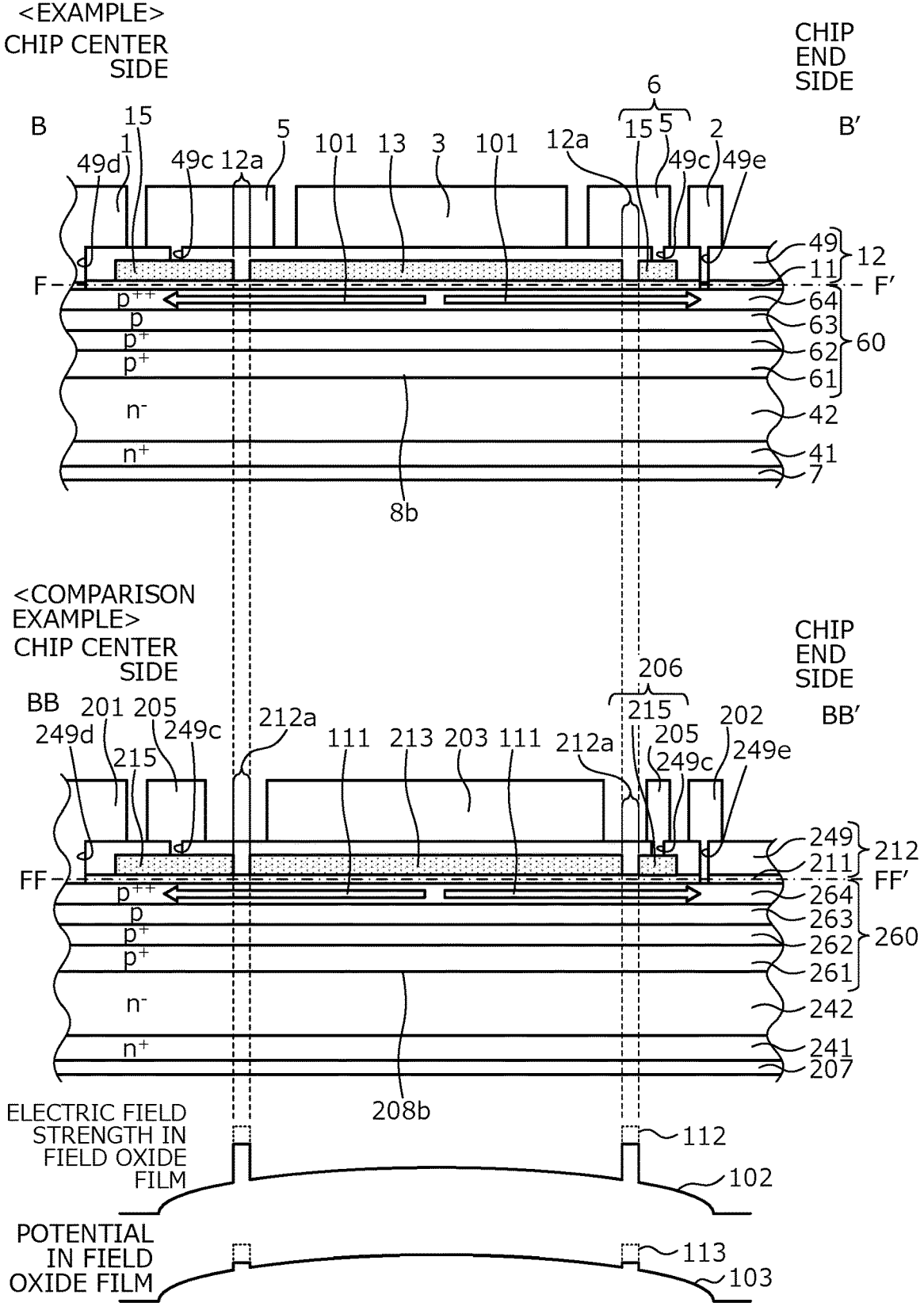
FIG. 16 is a diagram depicting results of simulation of electric field strength distribution curves and potential distribution curves in field oxide films of an example and a comparison example.

FIG. 16 is a diagram depicting results of simulation of electric field strength distribution curves and potential distribution curves in field oxide films of an example and a comparison example. FIG. 16 depicts electric field strength distribution curves 102, 112 and potential distribution curves 103, 113 (bottom) in the field oxide films 11, 211 when displacement current (hole current) 101, 111 flows in the p-type peripheral regions 60, 260 of the example and the comparison example, the curves depicting distribution of electric field and potential in the structures of the silicon carbide semiconductor device 10 according to the first embodiment (hereinafter, the example) (top: corresponds to FIG. 4) and in structures of a silicon carbide semiconductor device 210 as the comparison example (middle: corresponds to FIG. 20).

In the example and the comparison example, when voltage that is positive with respect to the source electrodes 1, 201 is applied to the drain electrodes 7, 207 and the pn junctions 8b, 208b between the p-type peripheral regions 60, 260 and the $n^-$-type drift regions 42, 242 are reverse biased, holes in the p-type peripheral regions 60, 260 are pulled out to the metal layers of the source potential via the $p^{++}$-type outer peripheral contact regions 64, 264. As a result, the displacement currents 101, 111 flow in the $p^{++}$-type outer peripheral contact regions 64, 264, in a direction parallel to the front surfaces of the semiconductor substrates 20, 220, from positions facing substantially centers of the gate pads 3, 203 to the contact holes 49d, 49e constituting contacts with the metal layers of the source potential.

The electric field strength distribution curve 102 and the potential distribution curve 103 in the field oxide film 11 (horizontal cross-section along cutting line F-F') of the example are indicated by solid lines while the electric field strength distribution curve 112 and the potential distribution curve 113 in the field oxide film 211 (horizontal cross-section along cutting line FF-FF') of the comparison example are indicated by dashed lines. In the electric field strength distribution curve 112 and the potential distribution curve 113 in the field oxide film 211 of the comparison example, portions where the electric field strength distribution curve 102 and the potential distribution curve 103 in the field oxide film 11 of the example overlap are each indicated by a solid line. In the field oxide films 11, 211 means a vicinity of a surface in contact with the interlayer insulating films 49, 249.

From the results depicted in FIG. 16, it was confirmed that in the example and the comparison example, when the displacement currents 101, 111 flow, the electric field strength and the potential in the field oxide films 11, 211 exhibit the same distribution curves at portions covered by the polysilicon layers 13, 15, 213, 215 while at the portions 12a between the adjacent polysilicon layers 13, 15 and at portions 212a between the adjacent polysilicon layers 213, 215, the distribution curves of the electric field strength and the potential protrude higher than other portions thereof. Further, it was confirmed that in the example, the electric field strength and the potential were lower at the portion 12a of the insulation layer 12 between the polysilicon layers 13, 15 that are adjacent to each other as compared to that in the comparison example.

In the comparison example, the portion 212a of the insulation layer 212 between the polysilicon layers 213, 215 that are adjacent to each other is not covered by a metal layer and thus, the surface of the portion 212a of the insulation layer 212 is floating electrically and the potential is not fixed. Therefore, during switching, accompanying a rise in the voltage that is positive with respect to the source electrode 201 and applied to the drain electrode 207, the potential of the insulation layer 212 (the field oxide film 211 and the interlayer insulating film 249) easily rises when the potential of the semiconductor substrate 220 (the p-type peripheral region 260) rises directly beneath the gate pad 203, at the portion 212a between the polysilicon layers 213, 215 that are adjacent to each other.

On the other hand, in the example, the portion 12a of the insulation layer 12 between the polysilicon layers 13, 15 that are adjacent to each other is covered by the gate metal wiring layer 5, whereby the surface of the portion 12a of the insulation layer 12 is fixed to the potential (for example, about 15V or more) of the gate metal wiring layer 5. Thus, during switching, accompanying a rise in the voltage that is positive with respect to the source electrode 1 and applied to the drain electrode 7, even when the potential of the semiconductor substrate 20 (the p-type peripheral region 60) rises directly beneath the gate pad 3, the potential of the surface of the portion 12a of the insulation layer 12 does not easily rise. As a result, electric field applied to the portion 12a of the insulation layer 12 may be mitigated.

Figure 17A:
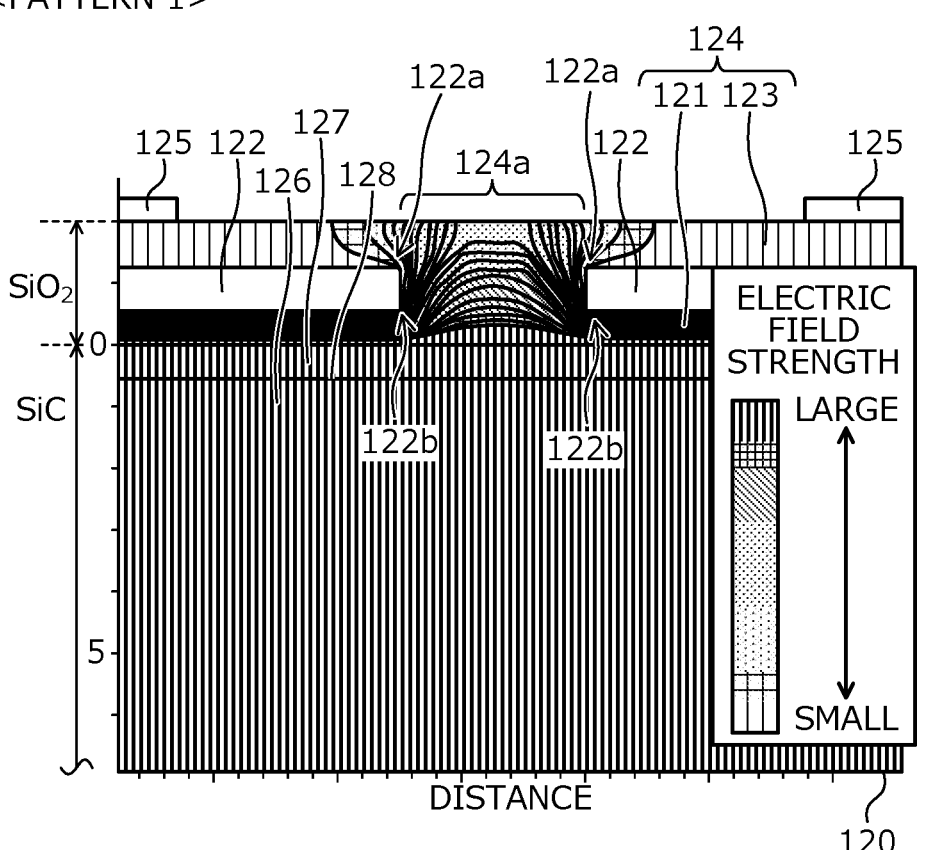
FIG. 17A is a cross-sectional view depicting results of simulation of electric field distributions in insulation layers.
Figure 17B:
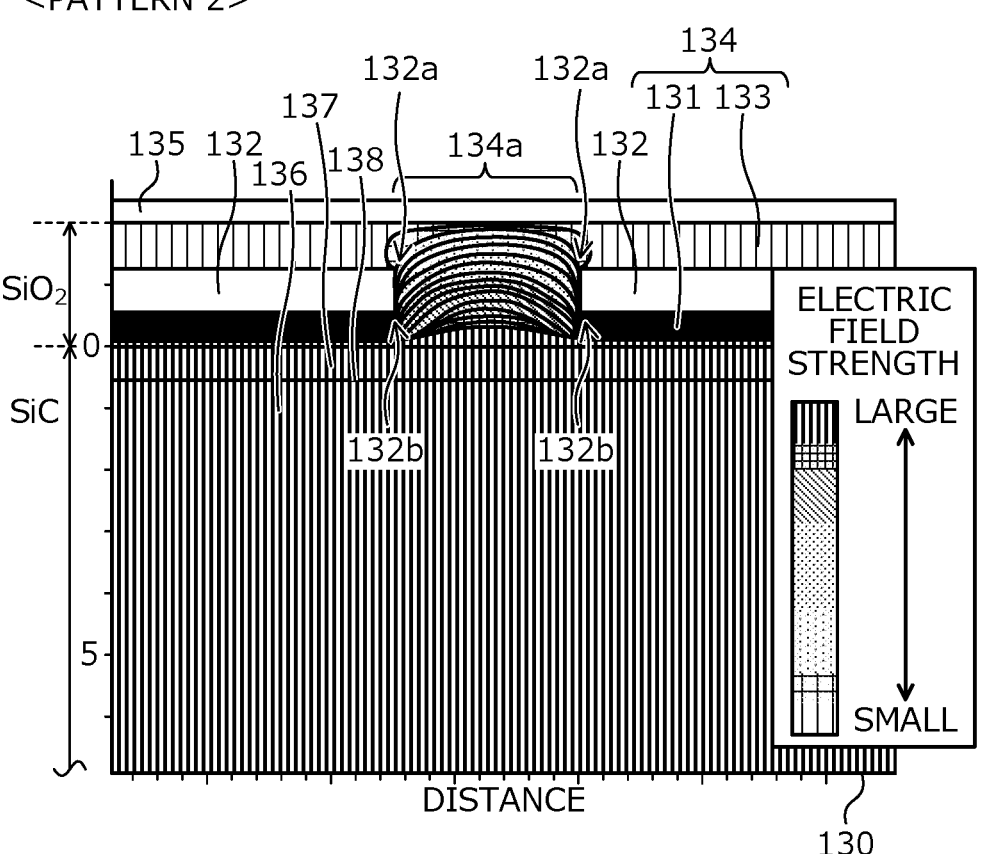
FIG. 17B is a cross-sectional view depicting results of the simulation of the electric field distributions in the insulation layers.

With respect to the example and the comparison example described, electric field distributions of the portions 12a, 212a of the insulation layers 12, 212, respectively, between the polysilicon layers 13, 15 that are adjacent to each other and the polysilicon layers 213, 215 that are adjacent to each other were simulated. FIGS. 17A and 17B are cross-sectional views depicting results of the simulation of the electric field distributions in the insulation layers. The electric field distributions in insulation layers 124, 134 of patterns 1, 2 are depicted in FIGS. 17A and 17B, respectively. The pattern 1 corresponds to the portion 212a of the insulation layer 212 between the polysilicon layers 213, 215 that are adjacent to each other, in the comparison example. The pattern 2 corresponds to the portion 12a of the insulation layer 12 between the polysilicon layers 13, 15 that are adjacent to each other, in the example.

In particular, the pattern 1 includes the insulation layer 124 formed by a field oxide film 121 and an interlayer insulating film 123 stacked sequentially on a front surface of a semiconductor substrate 120, in the order stated; polysilicon layers 122 provided in the insulation layer 124; and a metal layer 125 provided on the insulation layer 124. An n-type region 126 is provided in the semiconductor substrate 120; a p-type region 127 is provided between the front surface of the semiconductor substrate 120 and the n-type region 126. A portion 124a of the insulation layer 124 provided between the polysilicon layers 122 corresponds to the portion 212a of the insulation layer 212 between the polysilicon layers 213, 215 that are adjacent to each other, in the comparison example.

The metal layer 125 corresponds to the gate metal wiring layer 205 or the gate pad 203 of the comparison example. During simulation, the potential of the metal layer 125 was the ground potential. The n-type region 126 and the p-type region 127 correspond, respectively, to the n⁻-type drift region 242 and the p-type peripheral region 260 of the comparison example. In the pattern 1, under the conditions of a pn junction 128 between the p-type region 127 and the n-type region 126 being reverse biased, and hole current (corresponds to the displacement current 111 in FIG. 16) flowing in the p-type region 127 in a direction parallel to the front surface of the semiconductor substrate 120, the electric field distribution in the insulation layer 124 was simulated.

The pattern 2 includes the insulation layer 134 formed by a field oxide film 131 and an interlayer insulating film 133 stacked sequentially on a front surface of a semiconductor substrate 130 in the order state; polysilicon layers 132 provided in the insulation layer 134; and a metal layer 135 provided on the insulation layer 134. An n-type region 136 is provided in the semiconductor substrate 130 and a p-type region 137 is provided between the front surface of the semiconductor substrate 130 and the n-type region 136. A portion 134a of the insulation layer 134 between the polysilicon layers 132 corresponds to the portion 12a of the insulation layer 12 between the polysilicon layers 13, 15 that are adjacent to each other, in the example. The metal layer 135 corresponds to the gate metal wiring layer 5 of the example. During simulation, the potential of the metal layer 135 was the ground potential.

While a metal layer that corresponds to the gate pad 3 of the example is not depicted, the metal layer is provided on the insulation layer 134, apart from the metal layer 135, at a position facing one of the polysilicon layers 132 in the depth direction. The n-type region 136 and the p-type region 137 correspond, respectively, to the n⁻-type drift region 42 and the p-type peripheral region 60 of the example. In the pattern 2, under conditions of a pn junction 138 between the p-type region 137 and the n-type region 136 being reverse biased, and hole current (corresponds to the displacement current 101 in FIG. 16) flowing in the p-type region 137 in a direction parallel to the front surface of the semiconductor substrate 130, the electric field distribution in the insulation layer 134 was simulated.

From the results depicted in FIGS. 17A and 17B, in the patterns 1, 2, while high electric field generated in the semiconductor substrates 120, 130 by the rise in the potential of the p-type regions 127, 137 (for example, estimated to be about 300V) enters the upper field oxide films 121, 131 and is stopped by the polysilicon layers 122, 132; from the portions 124a, 134a that separate, respectively, the polysilicon layers 122, 132 of the insulation layers 124, 134, the high electric field passes upward (direction to the interlayer insulating films 123, 133) through the portions 124a, 134a and out in a direction orthogonal to the front surfaces of the semiconductor substrates 120, 130. As a result, in the portions 124a, 134a of the insulation layers 124, 134, the electric field concentrates most at side-surface lower ends (borders between side surfaces and lower surfaces) 122b, 132b of the polysilicon layers 122, 132.

It was confirmed that at this time, in the pattern 1, the surface of the insulation layer 124 is exposed between adjacent portions of the metal layer 125 and is electrically floating, whereby the high electric field generated in the semiconductor substrate 120 accompanying a rise in the potential of the p-type region 127 passes upward and out through the portion 124a of the insulation layer 124 between the adjacent polysilicon layers 122, from the surface of the insulation layer 124. It was confirmed that as a result, in the portion 124a of the insulation layer 124, high electric field spreads so as to surround side-surface upper ends (borders between side surfaces and upper surface) 122a of the polysilicon layers 122, whereby the concentration of electric field at the side-surface lower ends 122b of the polysilicon layers 122 increases and the field oxide film 121 dielectrically breaks down at the side-surface lower ends 122b of the polysilicon layers 122.

On the other hand, in the pattern 2, it was confirmed that the portion 134a of the insulation layer 134 between the polysilicon layers 132 adjacent to each other is fixed to the potential (i.e., the ground potential) of the metal layer 135, whereby even when the potential of the p-type region 137 rises, the high electric field that from inside the semiconductor substrate 130, passes upward and out through the portion 134a of the insulation layer 134 between the polysilicon layers 132 adjacent to each other does not easily reach the surface of the insulation layer 134. It was confirmed that as a result, in the portion 134a of the insulation layer 134, increases in the electric field in vicinities of the side-surface upper ends 132a of the polysilicon layers 132 may be suppressed, whereby the concentration of electric field at the side-surface lower ends 132b of the polysilicon layers 132 is suppressed and dielectric breakdown of the field oxide film 131 may be prevented.

Further, in FIGS. 17A and 17B, in the patterns 1, 2, the states of equipotential lines in the insulation layers 124, 134 are depicted clearly and thus, while equipotential lines in the field oxide films 121, 131 directly beneath the polysilicon layers 122, 132 appear to be dense (equipotential lines being too close to each other appear blacked out), when a non-depicted enlarged view is viewed, in the pattern 2, it was confirmed by the inventor that the concentration of electric field at the side-surface lower ends 132b of the field oxide film 131 is suppressed more than is the concentration of the electric field at the side-surface lower ends 122b of the field oxide film 121 in the pattern 1.

Further, while not depicted, for each of the silicon carbide semiconductor devices 70, 80, 90 according to the second to fourth embodiments, respectively, the portion 12a of the insulation layer 12 between the polysilicon layers 13, 15 that are adjacent to each other is covered by the gate pad 73, the metal layers of the source potential (the source electrode 81, the source ring 82), and the gate metal wiring layer 5, whereby the potential of the surface of the portion 12a of the insulation layer 12 is fixed to a potential close to the ground potential with respect to the potential of the drain electrode 7 and thus, it is presumed that effects of the first and second experimental examples described above are obtained.

In the foregoing, the present invention is not limited to the embodiments described and various modifications within a range not departing from the spirit of the invention are possible. For example, effects similar to those of the present invention are obtained even in an instance in which when a pn junction between the p-type peripheral region directly beneath the gate pad and an n⁻-type drift region is reverse biased, a metal layer that is fixed to a potential lower than that of the drain electrode (or close to the ground potential) and that, instead of the gate metal wiring layer, the gate pad, and the source electrode, covers a polysilicon layer directly beneath the gate pad and an polysilicon layer of the gate runner adjacent thereto with an insulation layer intervening between the polysilicon layers.

Further, for example, instead of the trench gate structure, a device structure of the active region center portion may be a planar structure in which, in a device plan view, gate electrodes are provided in a planar shape on the front surface of the semiconductor substrate via a gate insulating film. Further, in this instance, the p-type peripheral region of the active region peripheral portion, for example, is in contact with at least a p-type base region and/or a p⁺⁺-type contact region configuring the planar gate structure or is electrically connected to these p-type regions. In the embodiments, while a first conductivity type is assumed to be an n-type and a second conductivity type is assumed to be a p-type, the present invention is similarly implemented when the first conductivity type is a p-type and the second conductivity type is an n-type.

As described above, an entire area of the uppermost surface of the front surface of the semiconductor substrate in the active region peripheral portion is fixed to a potential that is at most equal to the potential of the second electrode. As a result, in an instance in which the gate resistor formed by the third polysilicon layer is built-in on the front surface of the semiconductor substrate in the active region peripheral portion, the concentration of electric field at a portion between polysilicon layers adjacent to each other (between the first polysilicon layer and the second polysilicon layer) where electric field concentrates most in the active region peripheral portion may be suppressed.

The silicon carbide semiconductor device according to the present invention achieves an effect in that in the silicon carbide semiconductor device in which the gate resistor is built into the semiconductor substrate, dielectric breakdown may be prevented.

As described above, the silicon carbide semiconductor device according to the present invention is useful for power semiconductor devices used in power converting equipment, power source devices of various types of industrial machines, etc. and is particularly suitable for silicon carbide semiconductor modules in which multiple semiconductor chips (the semiconductor substrates) connected in parallel are mounted.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having a built-in gate resistor, the silicon carbide semiconductor device comprising:

a semiconductor substrate containing silicon carbide and having an active region center portion and an active region peripheral portion different from the active region center portion, the semiconductor substrate having a first main surface and a second main surface opposite to each other;

a first semiconductor region of a first conductivity type, provided in the semiconductor substrate;

a device structure provided in the active region center portion and having, at the first main surface of the semiconductor substrate, an insulated gate with a metal-oxide film-semiconductor (MOS) three-layer structure, a main current flowing through the device structure in a direction orthogonal to the first main surface of the semiconductor substrate, the insulated gate having a plurality of gate electrodes that constitute a metal of the insulated gate;

a second semiconductor region of a second conductivity type, provided in the semiconductor substrate and in the active region peripheral portion thereof, between the first main surface of the semiconductor substrate and the first semiconductor region, to thereby form a pn junction between the second semiconductor region and the first semiconductor region;

a plurality of polysilicon layers provided in the active region peripheral portion, at the first main surface of the semiconductor substrate via an insulating film, the plurality of polysilicon layers facing the second semiconductor region in a depth direction with the insulating film intervening therebetween;

an interlayer insulating film provided at the first main surface of the semiconductor substrate, the interlayer insulating film covering the device structure and the plurality of polysilicon layers;

a gate pad provided on the interlayer insulating film and electrically connected to the plurality of gate electrodes;

a first electrode provided at the first main surface of the semiconductor substrate and apart from the gate pad, the first electrode being electrically connected to the device structure and the second semiconductor region; and a second electrode provided at the second main surface of the semiconductor substrate, wherein the plurality of polysilicon layers includes:

a first polysilicon layer connected to the plurality of gate electrodes, a second polysilicon layer facing the first polysilicon layer via the interlayer insulating film in a direction parallel to the first main surface of the semiconductor substrate and facing the gate pad via the interlayer insulating film in the depth direction, and a third polysilicon layer electrically connecting the first polysilicon layer and the gate pad, the third polysilicon layer being connected in series to the plurality of gate electrodes via the first polysilicon layer, and connecting the first polysilicon layer and the second polysilicon layer, a portion of the third polysilicon layer constituting the gate resistor; and the silicon carbide semiconductor device further includes a third electrode provided on the interlayer insulating film and fixed to a potential lower than that of the second electrode when the pn junction is reverse biased, the third electrode covering the interlayer insulating film between the first polysilicon layer and the second polysilicon layer.

2. The silicon carbide semiconductor device according to claim 1, further comprising a gate metal wiring layer provided on the interlayer insulating film, and apart from the gate pad, the gate metal wiring being adjacent to the first polysilicon layer in the depth direction, wherein the gate metal wiring layer extends from a first position thereof facing the first polysilicon layer in the depth direction to a second position thereof facing an end of the second polysilicon layer via the interlayer insulating film in the depth direction, and the gate metal wiring layer constitutes the third electrode.

3. The silicon carbide semiconductor device according to claim 1, further comprising a gate metal wiring layer provided on the interlayer insulating film, and apart from the gate pad, the gate metal wiring layer being adjacent to the first polysilicon layer in the depth direction, wherein the gate pad extends from a first position thereof facing the second polysilicon layer via the interlayer insulating film in the depth direction to a second position thereof facing an end of the first polysilicon layer via the interlayer insulating film in the depth direction, and the gate pad constitutes the third electrode.

4. The silicon carbide semiconductor device according to claim 1, wherein in a plan view of the silicon carbide semiconductor device, the first polysilicon layer is disposed between the active region center portion and the second polysilicon layer, and the first electrode extends from a first position thereof facing the first polysilicon layer via the interlayer insulating film in the depth direction, to a second position thereof facing an end of the second polysilicon layer, and the first electrode constitutes the third electrode.

5. The silicon carbide semiconductor device according to claim 1, wherein the potential of the third electrode is in a range of −20V to +20V.

6. The silicon carbide semiconductor device according to claim 1, wherein the first polysilicon layer surrounds a periphery of the active region center portion and surrounds a periphery of the second polysilicon layer, in a plan view of the silicon carbide semiconductor device.

* * * * *